(12) United States Patent
Shur et al.

(10) Patent No.: US 9,859,461 B2
(45) Date of Patent: Jan. 2, 2018

(54) P-TYPE CONTACT TO SEMICONDUCTOR HETEROSTRUCTURE

(71) Applicant: Sensor Electronic Technology, Inc., Columbia, SC (US)

(72) Inventors: Michael Shur, Latham, NY (US); Alexander Dobrinsky, Loudonville, NY (US)

(73) Assignee: Sensor Electronic Technology, Inc., Columbia, SC (US)

( * ) Notice: Subject to any disclaimer, the term of this patent is extended or adjusted under 35 U.S.C. 154(b) by 0 days.

(21) Appl. No.: 15/208,350

(22) Filed: Jul. 12, 2016

(65) Prior Publication Data

US 2017/0018680 A1    Jan. 19, 2017

Related U.S. Application Data

(60) Provisional application No. 62/191,725, filed on Jul. 13, 2015.

(51) Int. Cl.
*H01L 33/06* (2010.01)
*H01L 31/0352* (2006.01)
(Continued)

(52) U.S. Cl.
CPC ............ *H01L 33/06* (2013.01); *H01L 27/153* (2013.01); *H01L 31/02161* (2013.01);
(Continued)

(58) Field of Classification Search
CPC ............ H01L 33/06; H01L 31/035236; H01L 31/022408; H01L 33/38; H01L 33/42;
(Continued)

(56) References Cited

U.S. PATENT DOCUMENTS 6,258,618 B1 * 7/2001 Lester ................... H01L 33/46
257/E33.068
7,180,088 B2 * 2/2007 Sugawara ............... H01L 33/32
257/13

(Continued)

FOREIGN PATENT DOCUMENTS

JP    2012119428 A    6/2012
JP    2012119692 A    6/2012
(Continued)

OTHER PUBLICATIONS

Park, H., International Application No. PCT/US2016/041932, dated Oct. 20, 2016, 11 pages.

*Primary Examiner* — William Coleman
(74) *Attorney, Agent, or Firm* — LaBatt, LLC

(57) ABSTRACT

A contact to a semiconductor heterostructure is described. In one embodiment, there is an n-type semiconductor contact layer. A light generating structure formed over the n-type semiconductor contact layer has a set of quantum wells and barriers configured to emit or absorb target radiation. An ultraviolet transparent semiconductor layer having a non-uniform thickness is formed over the light generating structure. A p-type contact semiconductor layer having a non-uniform thickness is formed over the ultraviolet transparent semiconductor layer.

20 Claims, 12 Drawing Sheets

(51) Int. Cl.
| | |
|---|---|
| *H01L 31/0224* | (2006.01) |
| *H01L 33/38* | (2010.01) |
| *H01L 33/42* | (2010.01) |
| *H01L 33/40* | (2010.01) |
| *H01L 31/0216* | (2014.01) |
| *H01L 33/44* | (2010.01) |
| *H01L 33/32* | (2010.01) |
| *H01L 31/0304* | (2006.01) |
| *H01L 33/20* | (2010.01) |
| *H01L 33/00* | (2010.01) |
| *H01L 31/109* | (2006.01) |
| *H01L 27/15* | (2006.01) |

(52) U.S. Cl.
CPC ........ *H01L 31/022408* (2013.01); *H01L 31/022466* (2013.01); *H01L 31/03044* (2013.01); *H01L 31/035236* (2013.01); *H01L 31/109* (2013.01); *H01L 33/0025* (2013.01); *H01L 33/0075* (2013.01); *H01L 33/20* (2013.01); *H01L 33/32* (2013.01); *H01L 33/38* (2013.01); *H01L 33/405* (2013.01); *H01L 33/42* (2013.01); *H01L 33/44* (2013.01)

(58) Field of Classification Search
CPC ........ H01L 31/022466; H01L 33/405; H01L 31/02161; H01L 27/153; H01L 33/32; H01L 31/03044; H01L 33/20; H01L 33/0025; H01L 31/109; H01L 33/007
See application file for complete search history.

(56) References Cited

U.S. PATENT DOCUMENTS

| | | | |
|---|---|---|---|
| 7,771,917 B2* | 8/2010 | Sandhu | B82Y 10/00 430/320 |
| 8,618,560 B2* | 12/2013 | D'Evelyn | H01L 33/44 257/79 |
| 8,686,459 B2* | 4/2014 | Tsutsumi | H01J 1/02 257/99 |
| 8,787,418 B2 | 7/2014 | Shur et al. | |
| 8,835,954 B2* | 9/2014 | Fujimoto | H01L 33/38 257/13 |
| 9,159,880 B2* | 10/2015 | Asakawa | H01L 33/38 |
| 2009/0263729 A1* | 10/2009 | Sinha | B82Y 10/00 430/5 |
| 2013/0146907 A1 | 6/2013 | Lunev et al. | |
| 2013/0221406 A1 | 8/2013 | Gaska et al. | |
| 2014/0077154 A1 | 3/2014 | Shatalov et al. | |
| 2015/0108428 A1 | 4/2015 | Shatalov et al. | |
| 2016/0027970 A1 | 1/2016 | Shatalov et al. | |

FOREIGN PATENT DOCUMENTS

| | | |
|---|---|---|
| KR | 20130129683 A | 11/2013 |
| KR | 20140019508 A | 2/2014 |
| KR | 20150017543 A | 2/2015 |

\* cited by examiner

US 9,859,461 B2

P-TYPE CONTACT TO SEMICONDUCTOR HETEROSTRUCTURE

REFERENCE TO RELATED APPLICATIONS

The present patent application claims the benefit of U.S. Provisional Application No. 62/191,725, which was filed on 13 Jul. 2015; and which is hereby incorporated by reference.

TECHNICAL FIELD

The present invention relates generally to device contacts, and more particularly, to contacts for group III nitride semiconductor heterostructures used with optoelectronic devices such as ultraviolet light emitting/sensing devices.

BACKGROUND ART

A semiconductor light-emitting device (LED) is one type of optoelectronic device that utilizes a contact for a group III nitride semiconductor heterostructure. Light extraction from an LED is limited due to total internal refraction of the light within the material of a light generating structure, active region or light-emitting layer used with the group III nitride semiconductor heterostructure. Typical refractive indices for group III nitride semiconductor devices are in the range of 2.2 to 2.7. The amount of extraction depends heavily on the macroscopic geometry of the LED and the three-dimensional emission profile of light generated within the light generating structure. Before it can escape, most of the light generated within the device is attenuated by the absorbance in the surrounding materials, e.g. epitaxial layers, confining regions, substrate, die attach materials, and electrical contacts.

Typical devices generate photons at the p-n junction that are emitted into a wide range of directions (nearly isotropic emission). As a result, a large percentage of emitted light rays are incident at a device/ambient interface at angles greater than a critical angle for exiting the semiconductor heterostructure. These rays are internally reflected and are susceptible to absorption within the device. For a typical AlGaN-based semiconductor heterostructure of an LED, only a small fraction of photons are incident on the top surface within the critical angle for transmission into epoxy. The remaining light undergoes at least one internal reflection before escaping the chip.

The internally-reflected light in AlGaN LEDs is also susceptible to absorption by a p-layer contact. For ultraviolet LEDs, a metal contacting a p-type semiconductor contact is typically poorly reflective. In some instances, aluminum has been used with a p-type semiconductor contact to improve reflectivity, however, aluminum does not form a good Ohmic contact to a p-type metal.

SUMMARY OF THE INVENTION

This Summary Of The Invention introduces a selection of certain concepts in a brief form that are further described below in the Detailed Description Of The Invention. It is not intended to exclusively identify key features or essential features of the claimed subject matter set forth in the Claims, nor is it intended as an aid in determining the scope of the claimed subject matter.

Aspects of the present invention provide a p-type layer to a group III nitride semiconductor heterostructure that can be used to form an optoelectronic device, such as a light-emitting device (LED). The heterostructure can include an n-type semiconductor contact layer; a light generating structure formed over the n-type semiconductor contact layer and having a set of quantum wells and barriers configured to emit or absorb target radiation; an ultraviolet transparent semiconductor layer having a non-uniform thickness and formed over the light generating structure; and a p-type contact semiconductor layer having a non-uniform thickness and formed over the ultraviolet transparent semiconductor layer.

Both the ultraviolet transparent semiconductor layer and the p-type contact semiconductor layer can each have a shape that corresponds to their non-uniform thickness. In one embodiment, the shape of the ultraviolet transparent semiconductor layer is complementary to the shape of the p-type contact semiconductor layer. The shape of the ultraviolet transparent semiconductor layer can be formed by patterning. In one embodiment, the pattern of the ultraviolet transparent semiconductor layer and the p-type contact semiconductor layer can include a plurality of elevated sections alternating with a plurality of lower sections. In one embodiment, the elevated sections of the ultraviolet transparent semiconductor layer can be formed in the lower sections of the p-type contact semiconductor layer, and the lower sections of the ultraviolet transparent semiconductor layer can be formed in the elevated sections of the p-type contact semiconductor layer.

In one embodiment, the p-type contact semiconductor layer can include a set of columnar structures. A transparent contact can be formed over the p-type contact semiconductor layer to connect each of the columnar structures. In one embodiment, a continuous partially reflective metallic contact can be formed over the p-type contact semiconductor layer to connect each of the columnar structures. In one embodiment, a discontinuous partially reflective metallic contact can be formed over the p-type contact semiconductor layer. The discontinuous partially reflective metallic contact can include a plurality of discontinuous sections of the discontinuous partially reflective metallic contact, with each discontinuous section formed directly over one of the columnar structures.

A discontinuous partially transmitting passivation layer can be used in conjunction with the discontinuous partially reflective metallic contact formed over the p-type contact semiconductor layer. In particular, the discontinuous partially transmitting passivation layer contact can include a plurality of discontinuous sections of the partially transmitting passivation layer, with each discontinuous section of the partially transmitting passivation layer formed directly over a portion of the ultraviolet transparent semiconductor layer. In one embodiment, each discontinuous section of the partially transmitting passivation layer can contact a side surface of one of the discontinuous sections of the discontinuous partially reflective metallic contact.

In one embodiment, the p-type contact semiconductor layer can include a superlattice structure. The ultraviolet transparent semiconductor layer can also include a superlattice structure.

A heterostructure of one of the various embodiments described herein can include a substrate and a group III nitride semiconductor layer epitaxially grown over the substrate. A light generating structure having a set of quantum wells and barriers can be formed over the group III nitride semiconductor layer and be configured to emit and/or absorb target radiation. A set of columnar structures can be formed over the light generating structure. The set of columnar structures can include a plurality of p-type columnar structures and a plurality of n-type columnar structures extending laterally over the light generating structure, with each p-type columnar structure adjacent to an n-type columnar structure. This can form an alternating pattern of p-type columnar structures and n-type columnar structures that provides a lateral current throughout the light generating structure. In one embodiment, the set of columnar structures can extend from the light generating structure outward from the substrate.

This heterostructure can further include plurality of insulating layers, with each insulating layer formed between a p-type columnar structure and an n-type columnar structure. Each insulating layer can include a dielectric material formed between a first metallic contact and a second metallic contact, wherein each of the first metallic contact and the second metallic contact abuts one of a p-type columnar structure and an n-type columnar structure. In one embodiment, each insulating layer can substantially enclose one of a p-type columnar structure or an n-type columnar structure on three sides. In one embodiment, each p-type columnar structure can be separated from an immediately adjacent n-type columnar structure by a predetermined spacing. In one embodiment, each of the p-type columnar structures and the n-type columnar structures can penetrate into the light generating structure. In one embodiment, each of the p-type columnar structures can comprise an electron blocking layer formed between one end of the p-type columnar structures and the light generating structure. In this manner, the electron blocking layer physically isolates the p-type columnar structures from the n-type columnar structures.

In one embodiment, the set of columnar structures of this heterostructure can extend from the light generating structure towards the substrate. In this manner, a face of the light generating structure opposing the set of columnar structures and the substrate can emit light. In one embodiment, an end of each of the p-type columnar structures can be formed on a surface of the light generating structure and an end of each of the n-type columnar structures can be formed in an interior portion of the group III nitride semiconductor layer. In one embodiment, each of the p-type columnar structures can penetrate into the light generating structure. In one embodiment, an encapsulant can encapsulate the substrate, the group III nitride semiconductor layer, the light generating structure, and the set of columnar structures. The encapsulant can comprise a transparent ultraviolet material. The transparent ultraviolet material can comprise a fluoropolymer.

Another heterostructure of one of the various embodiments described herein can include a substrate and a group III nitride semiconductor layer formed over the substrate. A light generating structure having a set of quantum wells and barriers configured to emit or absorb target radiation can be formed over the group III nitride semiconductor layer. A discontinuous p-type contact layer can be formed over the light generating structure, wherein the discontinuous p-type contact layer includes sections of the p-type contact layer. Each section of the p-type contact layer can be separated from an immediately adjacent section by a predetermined spacing. A discontinuous n-type contact layer can be formed over the light generating structure, wherein the discontinuous n-type contact layer includes sections of the n-type contact layer. Each section of the discontinuous n-type contact layer can be formed in the spacing between each of the discontinuous sections of the p-type contact layer. A plurality of p-type protrusions can extend from the discontinuous p-type contact layer, with each p-type protrusion extending from a discontinuous section of the discontinuous p-type contact layer into the light generating structure. A plurality of n-type protrusions can extend from the discontinuous n-type contact layer, with each n-type protrusion extending from a discontinuous section of the discontinuous n-type contact layer into the light generating structure.

In one embodiment, the light generating structure is a discontinuous light generating structure that can include sections of the light generating structure. In one embodiment, each of the sections of the light generating structure can be separated from an adjacent section of the light generating structure by one of a p-type protrusion and an n-type protrusion. In this manner, each p-type protrusion extending into the light generating structure can alternate with one n-type protrusion extending into the light generating structure. In one embodiment, the plurality of n-type protrusions can form a grid of parallel horizontal protrusions and vertical protrusions, and the plurality of p-type protrusions can form an array of rectangular regions of p-type protrusions, with each p-type protrusion located in a spacing separating one of the parallel horizontal protrusions and vertical protrusions.

A first aspect of the invention provides a heterostructure, comprising: an n-type semiconductor contact layer; a light generating structure formed over the n-type semiconductor contact layer and having a set of quantum wells and barriers configured to emit or absorb target radiation; an ultraviolet transparent semiconductor layer having a non-uniform thickness and formed over the light generating structure; and a p-type contact semiconductor layer having a non-uniform thickness and formed over the ultraviolet transparent semiconductor layer.

A second aspect of the invention provides a heterostructure, comprising: a substrate; a group III nitride semiconductor layer epitaxially grown over the substrate; a light generating structure formed over the group III nitride semiconductor layer and having a set of quantum wells and barriers configured to emit or absorb target radiation; and a set of columnar structures formed over the light generating structure, the set of columnar structures including a plurality of p-type columnar structures and a plurality of n-type columnar structures extending laterally over the light generating structure, with each p-type columnar structure adjacent to an n-type columnar structure, forming an alternating pattern of p-type columnar structures and n-type columnar structures that provides a lateral current throughout the light generating structure.

A third aspect of the invention provides a method, comprising: forming a heterostructure, comprising: a substrate; a group III nitride semiconductor layer formed over the substrate; a light generating structure formed over the group III nitride semiconductor layer and having a set of quantum wells and barriers configured to emit or absorb target radiation; a set of columnar structures formed over the light generating structure, the set of columnar structures including a plurality of p-type columnar structures and a plurality of n-type columnar structures extending laterally over the light generating structure, with each p-type columnar structure adjacent to an n-type columnar structure, forming an alternating pattern of p-type columnar structures and n-type columnar structures that provides a lateral current throughout the light generating structure.

A fourth aspect of the invention provides a heterostructure, comprising: a substrate; a group III nitride semiconductor layer formed over the substrate; a light generating structure formed over the group III nitride semiconductor layer and having a set of quantum wells and barriers configured to emit or absorb target radiation; a discontinuous p-type contact layer formed over the light generating structure, wherein the discontinuous p-type contact layer includes sections of the p-type contact layer, each section of the p-type contact layer separated from an immediately adjacent section by a predetermined spacing; a discontinuous n-type contact layer formed over the light generating structure, wherein the discontinuous n-type contact layer includes sections of the n-type contact layer, wherein each section of the discontinuous n-type contact layer is formed in the spacing between each of the discontinuous sections of the p-type contact layer; a plurality of p-type protrusions extending from the discontinuous p-type contact layer, with each p-type protrusion extending from a discontinuous section of the p-type contact layer into the light generating structure; and a plurality of n-type protrusions extending from the discontinuous n-type contact layer, with each n-type protrusion extending from a discontinuous section of the n-type contact layer into the light generating structure, wherein the plurality of n-type protrusions and the plurality of p-type protrusions are in parallel, and wherein each n-type protrusion is formed between a pair of p-type protrusions.

The illustrative aspects of the invention are designed to solve one or more of the problems herein described and/or one or more other problems not discussed.

BRIEF DESCRIPTION OF THE DRAWINGS

These and other features of the disclosure will be more readily understood from the following detailed description of the various aspects of the present invention taken in conjunction with the accompanying drawings that depict various aspects of the invention.

FIG. 8A shows a schematic of an optoelectronic device having a p-type contact to a semiconductor heterostructure according to an embodiment of the present invention, wherein p-type columnar structures alternate with n-type columnar structures to form lateral current in a light generating structure, while

It is noted that the drawings may not be to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

Figure 1:
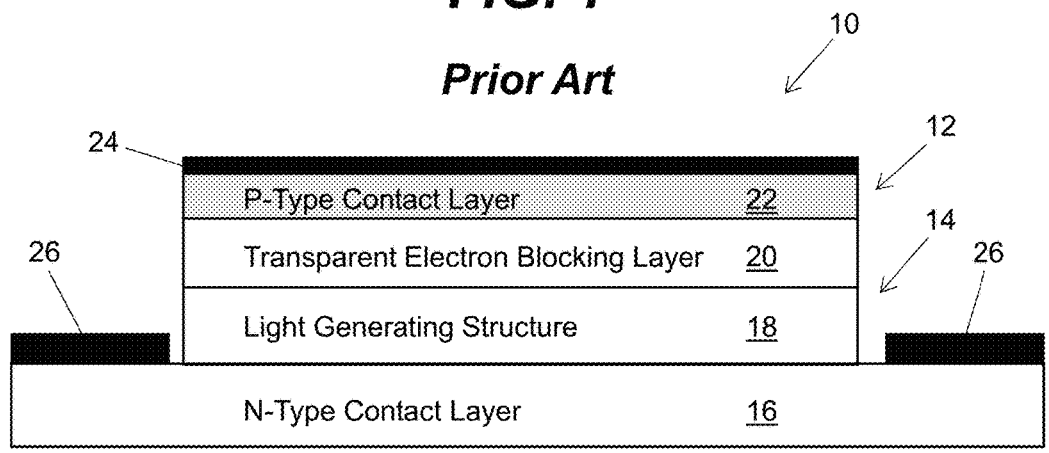
FIG. 1 shows a schematic of an optoelectronic device having a p-type contact to a semiconductor heterostructure according to the prior art.

The various embodiments of the present invention are directed to providing a p-type contact to a group III nitride semiconductor heterostructure in the formation of an optoelectronic device. Examples of an optoelectronic device can include, but are not limited to, light emitting devices, light emitting diodes (LEDs), including conventional and super luminescent LEDs, light emitting solid state lasers, laser diodes, photodetectors, photodiodes, and high-electron mobility transistors (HEMTs). Examples of optoelectronic devices can be configured to emit electromagnetic radiation from a light generating structure such as an active region upon application of a bias. The electromagnetic radiation emitted by these optoelectronic devices can comprise a peak wavelength within any range of wavelengths, including visible light, ultraviolet radiation, deep ultraviolet radiation, infrared light, and/or the like. For example, these optoelectronic devices can emit radiation having a dominant wavelength within the ultraviolet range of wavelengths. As an illustration, the dominant wavelength can be within a range of wavelengths of approximately 210 nanometers (nm) to approximately 350 nm.

A layer of the p-type contact and/or the group III nitride semiconductor heterostructure can be considered to be transparent to radiation of a particular wavelength when the layer allows an amount of the radiation radiated at a normal incidence to an interface of the layer to pass there through. For example, a layer can be configured to be transparent to a range of radiation wavelengths corresponding to a peak emission wavelength for light, such as ultraviolet light or deep ultraviolet light, emitted by the light generating structure (e.g., peak emission wavelength +/− five nanometers). As used herein, a layer is transparent to radiation if it allows more than approximately five percent of the radiation to pass there through, while a layer can also be considered to be transparent to radiation if it allows more than approximately ten percent of the radiation to pass there through. Defining a layer to be transparent to radiation in this manner is intended to cover layers that are considered transparent and semi-transparent.

A layer of the p-type contact and/or the group III nitride semiconductor heterostructure can be considered to be reflective when the layer reflects at least a portion of the relevant electromagnetic radiation (e.g., light having wavelengths close to the peak emission of the light generating structure). As used herein, a layer is partially reflective to radiation if it can reflect at least approximately five percent of the radiation, while a layer can also be considered to be partially reflective if it reflects at least thirty percent for radiation of the particular wavelength radiated normally to the surface of the layer. A layer can be considered highly reflective to radiation if it reflects at least seventy percent for radiation of the particular wavelength radiated normally to the surface of the layer.

The description that follows may use other terminology herein for the purpose of describing particular embodiments only and is not intended to be limiting of the disclosure. For example, unless otherwise noted, the term "set" means one or more (i.e., at least one) and the phrase "any solution" means any now known or later developed solution. The singular forms "a," "an," and "the" are intended to include the plural forms as well, unless the context clearly indicates otherwise. It will be further understood that the terms "comprises", "comprising", "includes", "including", "has", "have", and "having" when used in this specification, specify the presence of stated features, integers, steps, operations, elements, and/or components, but do not preclude the presence or addition of one or more other features, integers, steps, operations, elements, components, and/or groups thereof.

Turning to the drawings, FIG. 1 shows a schematic of an optoelectronic device 10 having a p-type contact 12 to a semiconductor heterostructure 14 according to the prior art. The heterostructure 14 includes an n-type semiconductor contact layer 16. The heterostructure 14 also includes a light generating structure 18 having a set of quantum wells and barriers configured to emit or absorb target radiation, which is formed over the n-type semiconductor contact layer 16. The p-type contact 12 includes a transparent electron blocking layer 20, such as an ultraviolet transparent semiconductor p-type layer having a laterally uniform thickness, which is formed over the light generating structure 18. In addition, the p-type contact 12 includes a p-type contact semiconductor layer 22 having a uniform thickness, which is formed over the transparent electron blocking layer 20. A p-type metal layer 24 is formed over the p-type contact semiconductor layer 22. Similarly, an n-type metal layer 26 is formed over the n-type contact semiconductor layer 16.

An ultraviolet LED is one type of optoelectronic device in which the device 10 of FIG. 1 has been implemented. Typically, the p-type contact semiconductor layer 22 of such an ultraviolet LED contains a high molar fraction of GaN, which makes the LED highly absorbing to the ultraviolet radiation. Attempts have been made to improve the performance of such an LED by modifying the p-type contact semiconductor layer 22. U.S. patent application Ser. No. 13/803,753, which is incorporated herein by reference, is one example in which the p-type contact semiconductor layer 22 has been modified in order to improve the performance of a device. In this example, a superlattice of $Al_xGa_{1-x}N/Al_yGa_{1-y}N$ layers is used to improve the transparent properties of a p-type contact semiconductor layer. However, there is a decreased conductivity with such a superlattice. As a result, there is a cost associated with using a superlattice of $Al_xGa_{1-x}N/Al_yGa_{1-y}N$ layers to improve the transparent properties of a p-type contact semiconductor layer.

Embodiments of the present invention propose a solution to this cost dilemma by combining the transparent properties of the p-type contact semiconductor layer with the transparent properties of the transparent electron blocking layer. For example, such a solution can include $Al_xGa_{1-x}N/Al_yGa_{1-y}N$ superlattices or a thin $Al_xGa_{1-x}N$ layer with a molar fraction of aluminum being higher than x=0.3, with a highly conductive p-type GaN rich layer that is highly absorbing to ultraviolet radiation and has high electrical conductivity.

It is understood that the transparent electron blocking layer, whether it comprises a homogeneous $Al_xGa_{1-x}N$ layer, an AlInGaBN layer, a superlattice of $Al_xGa_{1-x}N/Al_yGa_{1-y}N$, or a superlattice incorporating In and/or B, is selected to optimize reflective properties of the layer for a radiation coming from the light generating structure. For example, the transparent electron blocking layer can be selected to have an index of refraction to be smaller than the index of refraction of the light generating structure. This leads to a possibility of total internal refraction at an interface of the light generating structure and the transparent blocking layer. For example, the transparent electron blocking layer can form an electron blocking layer for blocking electron injection into the p-type contact semiconductor layer. In this manner, the transparent electron blocking layer can be $Al_xGa_{1-x}N$ with a molar fraction x higher than the molar fraction of aluminum nitride in the barriers of the light generating structure. For example, the molar fraction x can be 0.7 or higher for the transparent electron blocking layer.

Figure 2:
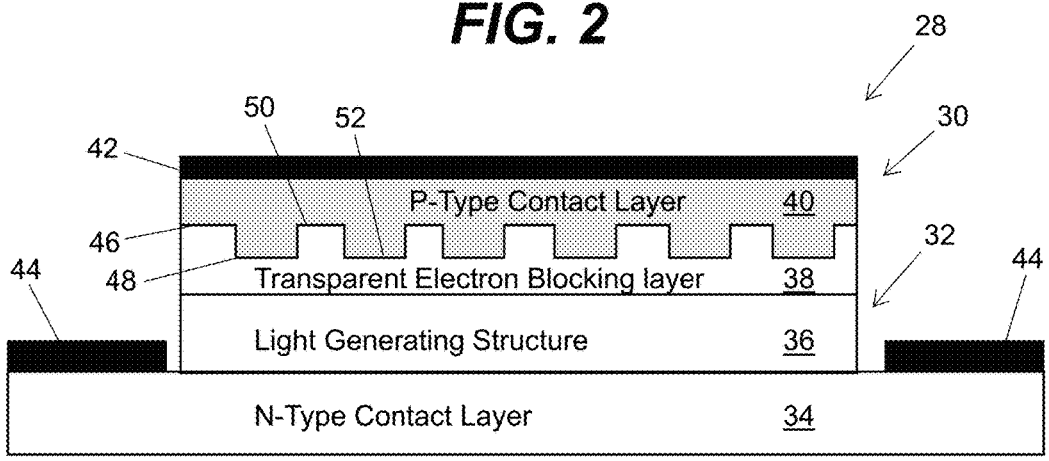
FIG. 2 shows a schematic of an optoelectronic device having a p-type contact to a semiconductor heterostructure according to an embodiment of the present invention, wherein a p-type contact layer and an ultraviolet transparent semiconductor layer both have a non-uniform thickness.

FIG. 2 shows a schematic of an optoelectronic device 28 having a p-type contact 30 to a semiconductor heterostructure 32 according to an embodiment of the present invention. The heterostructure 32 can include an n-type semiconductor contact layer 34. The heterostructure 32 can also include a light generating structure 36 having a set of quantum wells and barriers configured to emit or absorb target radiation that is formed over the n-type semiconductor contact layer 34.

The p-type contact 30 can include a transparent electron blocking layer 38, such as an ultraviolet transparent semiconductor layer, having a laterally non-uniform thickness that is formed over the light generating structure 36. The p-type contact 30 can also include a p-type contact semiconductor layer 40 having a non-uniform thickness formed over the transparent electron blocking layer 38. Having both the transparent electron blocking layer 38 and the p-type contact semiconductor layer 40 with a non-uniform thickness enables the optoelectronic device 28 to have a p-type material with a reduced lateral area and thickness. This can counter the effects of the p-type material as it is highly absorbing to ultraviolet radiation and has an impact on light extraction. A p-type metal layer 42 can be formed over the p-type contact semiconductor layer 40. Similarly, an n-type metal layer 44 can be formed over the n-type contact semiconductor layer 34.

The ultraviolet transparent semiconductor layer that can form the transparent electron blocking layer 38 and the p-type contact semiconductor layer 40 can each have a shape that corresponds to their non-uniform thickness. The shape of the ultraviolet transparent semiconductor layer can be complementary to receive the shape of the p-type contact semiconductor layer 40. In one embodiment, the shape of the ultraviolet transparent semiconductor layer and the p-type contact semiconductor layer 40 can each include a pattern that reduces their lateral area. In one embodiment, the pattern can include a plurality of elevated sections and a plurality of lower sections, with each elevated section followed by a lower section. As shown in FIG. 2, the elevated sections and the lower sections of the ultraviolet transparent semiconductor layer that forms the transparent electron blocking layer 38 are represented by reference numerals 46 and 48, respectively, while the elevated sections and the lower sections of the p-type contact semiconductor layer 40 are represented by reference numerals 50 and 52, respectively. In this manner, the elevated sections 46 of the ultraviolet transparent semiconductor layer can adjoin the elevated sections 50 of the p-type contact semiconductor layer 40, and the lower sections 48 of the ultraviolet transparent semiconductor layer can adjoin the lower sections 52 of the p-type contact semiconductor layer 40. In one embodiment, the lower sections 52 of the p-type contact semiconductor layer 40 can be separated by the elevated sections 50, with the elevated sections being comparable with the hole diffusion length in the p-type material.

In an illustrative embodiment, the optoelectronic device 28 can be a group III-V materials based device, in which some or all of the various layers are formed of elements selected from the group III-V materials system. In a more particular illustrative embodiment, the various layers of the optoelectronic device 28 can be formed of group III nitride based materials. Group III nitride materials comprise one or more group III elements (e.g., boron (B), aluminum (Al), gallium (Ga), and indium (In)) and nitrogen (N), such that $B_W Al_X Ga_Y In_Z N$, where $0 \leq W$, X, Y, $Z \leq 1$, and $W+X+Y+Z=1$. Illustrative group III nitride materials can include binary, ternary and quaternary alloys such as, AlN, GaN, InN, BN, AlGaN, AlInN, AlBN, AlGaInN, AlGaBN, AlInBN, and AlGaInBN with any molar fraction of group III elements.

In one embodiment, the n-type contact semiconductor layer 34 can be formed of $Al_x Ga_y In_z N$, where $0 \leq x$, y, $z \leq 1$, and $x+y+z=1$, or $Al_x Ga_{1-x} N$. The n-type contact semiconductor layer 34 can also have a thickness that ranges from about 0.1 microns to about 10 microns. In a more particular embodiment, the n-type contact semiconductor layer 34 can have a thickness of approximately 1 micron.

The light generating structure 36 can include any type of structure, such as a multiple quantum well structure, for generating any type of radiation or absorbing any target radiation. In one embodiment, the light generating structure 36 can include a multiple quantum well structure having a set of quantum wells and barriers. The barriers and quantum wells in the multiple quantum well structure of the light generating structure 36 can be formed using different material compositions. The barriers and quantum wells can also be formed using differing wide band gap semiconductor materials, such as any of the aforementioned differing group III nitride material compositions. In one embodiment, each barrier can comprise an $Al_x Ga_{1-x} N$ or $Al_x Ga_y In_{1-x-y} N$ composition comprising a molar fraction of aluminum nitride of 0.3-0.7, and each quantum well can comprise an $Al_x Ga_{1-x} N$ composition comprising a molar fraction of aluminum nitride of 0.1-0.5. In an embodiment, an aluminum compositional difference between the barrier and the quantum well is at least 10% of the barrier aluminum composition.

As described herein, the transparent electron blocking layer 38 can include an ultraviolet transparent semiconductor layer, which can be a p-type layer. In one embodiment, the ultraviolet transparent semiconductor layer can include $Al_x Ga1_{-x} N/AlGa_{1-y} N$ superlattices. In another embodiment, the ultraviolet transparent semiconductor layer can include a thin $Al_x Ga_{1-x} N$ layer with a molar fraction of aluminum being higher than x=0.3, with a highly conductive p-type GaN rich layer that is highly absorbing to ultraviolet radiation and has high electrical conductivity. In one embodiment, the ultraviolet transparent semiconductor layer can have a thickness of 50 to 500 nanometers.

The transparent electron blocking layer 38, whether it comprises a homogeneous $Al_x Ga_{1-x} N$ layer, an AlInGaBN layer, a superlattice of $Al_x Ga1_{-x} N/Al_y Ga_{1-y} N$, or a superlattice incorporating In and/or B, can be configured based on reflective properties of the layer for target radiation coming from or entering the light generating structure 36. For example, the transparent electron blocking layer 38 can be selected to have an index of refraction to be smaller than the index of refraction of the light generating structure 36. This leads to a possibility of total internal refraction at an interface of the light generating structure 36 and the transparent blocking layer 38. For example, the transparent electron blocking layer 38 can form an electron blocking layer for blocking electron injection into the p-type contact semiconductor layer 40. In this manner, the transparent electron blocking layer 38 can be $Al_x Ga_{1-x} N$ with a molar fraction x higher than the molar fraction of aluminum nitride in the barriers of the light generating structure 36. For example, the molar fraction x can be 0.7 or higher for the transparent electron blocking layer 38.

In one embodiment, the p-type contact semiconductor layer 40 can include AlGaN, GaN or AlInGaN with various molar ratios of aluminum nitride and/or indium nitride. In a particular embodiment, the p-type contact semiconductor layer 40 can include $Al_x Ga_{1-x} N$ with molar fraction x being at least 0.3. In another particular embodiment, the p-type contact semiconductor layer 40 can include a $Al_x Ga_{1-x} N/Al_y Ga_{1-y} N$ superlattice with 0.35<x<0.8 and 0<y<0.35. The p-type contact semiconductor layer 40 can have a thickness of 50 to 500 nanometers. The p-type semiconductor layer 40 can, for example, be grown using an epitaxial growth process resulting in compositional inhomogeneities as outlined for example in U.S. Pat. No. 8,787,418, which is hereby incorporated by reference.

The p-type metal layer 42 formed over the p-type contact semiconductor layer 40 and the n-type metal layer 44 formed over the n-type contact semiconductor layer 34 can form p-type and n-type ohmic contacts, respectively, to their corresponding layers. It is understood that a contact formed between two layers is considered "ohmic" or "conducting" when an overall resistance of the contact is no larger than the larger of the following two resistances: a contact resistance such that a voltage drop at the contact-semiconductor junction is no larger than two volts; and a contact resistance at least five times smaller than a resistance of a largest resistive element or layer of a device including the contact. In addition, the p-type metal layer 42 and the n-type metal layer 44 can each comprise several conductive and reflective metal layers. In one embodiment, the p-type metal layer 42 formed over the p-type contact semiconductor layer 40 can be used for flip chip packaging.

The ohmic metallic contact formed in FIG. 2 as well as the other embodiments depicted in FIGS. 3-7 can have a variety of arrangements. The ohmic metallic contact formed by the p-type metal layer 42 and the p-type contact semiconductor layer 40 in FIG. 2 can be located over only a fraction of the surface of the p-type contact semiconductor layer due to the elevated sections 50 and lower sections 52 of the p-type contact semiconductor layer 40. For example, the ohmic metallic contact can penetrate the lower sections of the p-type contact semiconductor layer 40. In another embodiment, the ohmic contact can be deposited only over the elevated sections of the p-type contact layer. For example, the lower sections of the p-type contact layer can contain a reflective material with a reflectance of at least 50%.

It is understood that the layer configuration of the p-type contact 30 and the semiconductor heterostructure 32 of the optoelectronic device 28 described herein is only illustrative. To this extent, the p-type contact 30 and the semiconductor heterostructure 32 can include alternative layer configurations, one or more additional layers, and/or the like. As a result, while the various layers are shown immediately adjacent to one another (e.g., contacting one another), it is understood that one or more intermediate layers can be present in the p-type contact 30 and the semiconductor heterostructure 32 of the optoelectronic device 28.

The non-uniform thickness of the transparent electron blocking layer 38 and the p-type contact semiconductor layer 40 can be on either a micro-scale level or a nano-scale level. Regardless, such non-uniformity exceeds the non-uniformity present due to the limits of normal growth processes. In one embodiment, the micro-scale level of non-uniformity can be obtained through patterning, while the nano-scale level of non-uniformity can be obtained by specifying 3-dimensional conditions for semiconductor growth. U.S. patent application Ser. No. 14/519,230, which is incorporated herein by reference, outlines 3-dimensional growth conditions for a heterostructure.

In one embodiment, the patterning of the ultraviolet transparent semiconductor layer that can form the transparent electron blocking layer 38 can be done by first placing a mask over the layer. Then photolithography and subsequently etching can be used to remove some of the masked regions. Because etching can introduce defects, an overgrowth technique can be used. U.S. patent application Ser. No. 13/775,038, which is incorporated herein by reference, discloses an overgrowth technique for an ohmic contact to a semiconductor. In this manner, the transparent electron blocking layer 38 with a non-uniform thickness can be obtained through masking and overgrowth. Then subsequent removal of the masking and overgrowth of the p-type contact layer 40 can result in a structure shown in FIG. 2.

Figure 3:
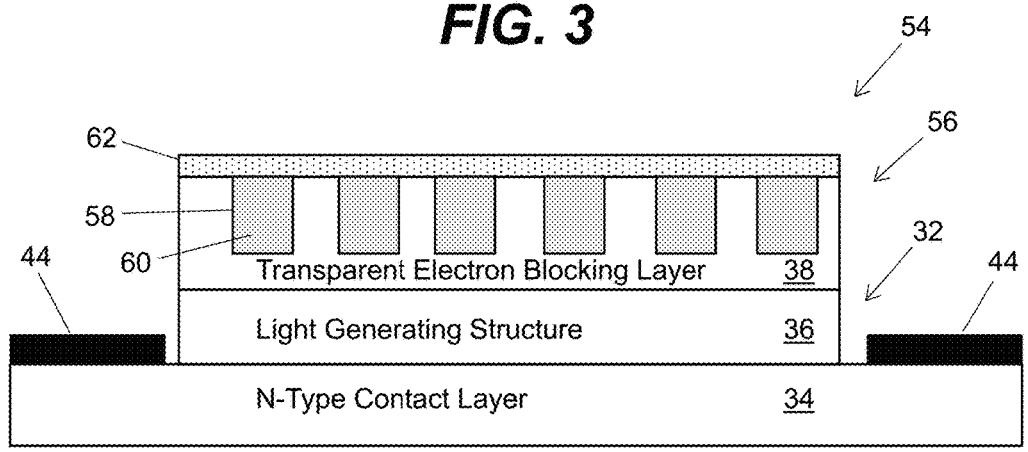
FIG. 3 shows a schematic of an optoelectronic device having a p-type contact to a semiconductor heterostructure according to an embodiment of the present invention, wherein a p-type contact layer includes a set of columnar structures connected by a transparent contact.

FIG. 3 shows a schematic of an optoelectronic device 54 having a p-type contact 56 to the semiconductor heterostructure 32 according to an embodiment of the present invention. In addition to the transparent electron blocking layer 38, the p-type contact 56 can include a p-type contact layer 58 formed from a set of columnar structures 60. In one embodiment, the set of columnar structures 60 of the p-type contact layer 58 can be formed by photolithography using etching of semiconductor layers.

FIG. 3 shows a transparent contact layer 62 can be formed over the p-type contact semiconductor layer 58 and columnar structures 60. In this manner, each of the columnar structures 60 can be connected by the transparent contact 62. The transparent contact 62 can be formed from, for example, any transparent oxide. Examples of transparent oxides include, but are not limited to, ITO and a $Ga_2O_3$ oxide doped with Mg. Also, any other combination of known transparent oxides such as $Ga_2O_3$, $In_2O_3$, $SnO_2$ can be used. In one embodiment, the transparent contact 62 can include thin metal films provided that the thickness of the film is selected to transmit a fraction of the radiation. For example, the transparent contact 62 can be selected to transmit at least 30% of the incoming radiation.

Figure 4:
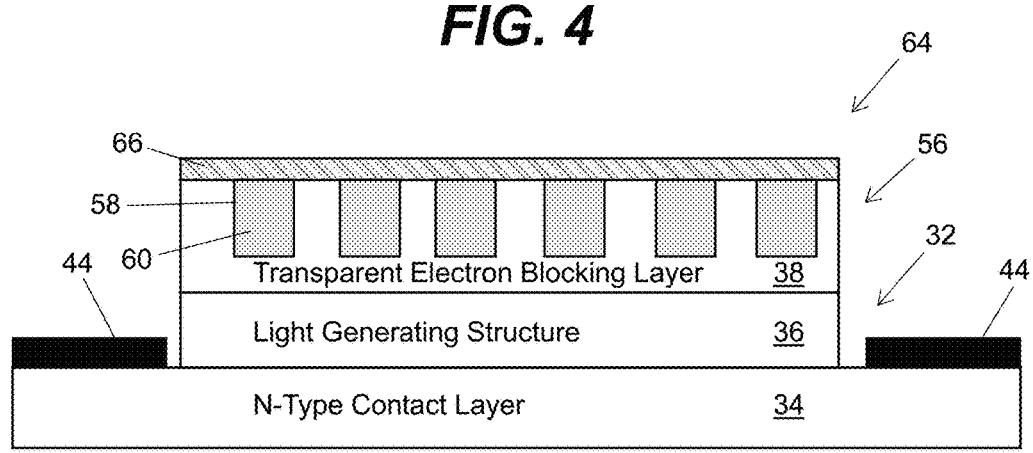
FIG. 4 shows a schematic of an optoelectronic device having a p-type contact to a semiconductor heterostructure according to an embodiment of the present invention, wherein a p-type contact layer includes a set of columnar structures connected by a continuous partially reflective metallic contact.

FIG. 4 shows a schematic of an optoelectronic device 64 that is similar to the optoelectronic device 54 depicted in FIG. 3. In this embodiment, a continuous partially reflective metallic contact 66 can be formed over the p-type contact semiconductor layer 58 and the columnar structures 60. In this manner, the continuous partially reflective metallic contact 66 can connect each of the columnar structures 60 in the p-type contact semiconductor layer 58. Examples of a continuous partially reflective metallic material that are suitable for use as the contact 66 can include, but are not limited to, aluminum, rhodium, or contacts comprising multiple metallic layers with at least one of these layers comprising aluminum or rhodium.

In one embodiment, the continuous partially reflective metallic contact 66 can be formed by sputtering or evaporating an aluminum film. U.S. patent application Ser. No. 13/711,675, which is incorporated herein by reference, provides further details of deposition of Ohmic and reflective contacts over a semiconductor layer.

Figure 5:
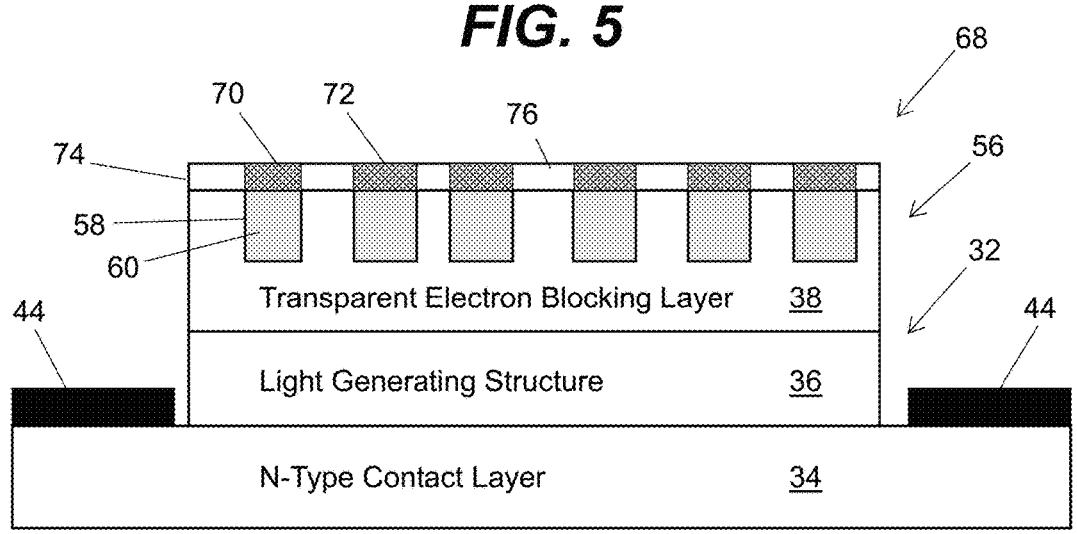
FIG. 5 shows a schematic of an optoelectronic device having a p-type contact to a semiconductor heterostructure according to an embodiment of the present invention, wherein a p-type contact layer includes a set of columnar structures connected by a discontinuous partially reflective metallic contact.

FIG. 5 shows a schematic of an optoelectronic device 68 with the set of columnar structures 60 connected by a discontinuous partially reflective metallic contact 70 formed over the p-type contact semiconductor layer 58 according to an embodiment. In one embodiment, the discontinuous partially reflective metallic contact 70 can include a plurality of discontinuous sections 72 of the discontinuous partially reflective metallic contact. As shown in FIG. 5, each discontinuous section 72 can be formed directly over one of the columnar structures 60.

The discontinuous partially reflective metallic contact 70, which can include any of the aforementioned partially reflective metallic material, can be formed by evaporating or sputtering aluminum or rhodium layer(s). U.S. patent application Ser. No. 13/711,675, which is incorporated herein by reference, provides further details of deposition of Ohmic and reflective contacts over a semiconductor layer.

FIG. 5 also shows that the optoelectronic device 68 can include a discontinuous partially transmitting passivation layer 74 formed over the p-type contact semiconductor layer 58. As used herein, a layer that is partially transmitting means having a transmission of at least 30% of the light of a target wavelength directed normal to the layer surface. Examples of a partially transmitting passivation material that is suitable for use as layer 74 include, but is not limited to, AAO, Hafnium, $SiO_2$, $CaF_2$, $MgF_2$, ZnO, AlZnO, and a fluoropolymetric encapsulant. As shown in FIG. 5, the partially transmitting passivation layer 74 can include a plurality of discontinuous sections 76 of the partially transmitting passivation layer. In one embodiment, each discontinuous section 76 of the partially transmitting passivation layer 74 can be formed directly over a portion of the ultraviolet transparent semiconductor layer that can form the transparent electron blocking layer 38. In this manner, each discontinuous section 76 of the partially transmitting passivation layer 74 can contact a side surface of one of the discontinuous sections 72 of the discontinuous partially reflective metallic contact 70. With this configuration, the regions between the columnar structures 60 that are covered by the discontinuous sections 76 of the partially transmitting passivation layer 74 can emit radiation. In one embodiment, the discontinuous sections 76 can be at least 30% transparent. In one embodiment, the ohmic contact can be deposited over the lower sections of the p-type contact semiconductor layer, and the reflective contact 70 can be at least 50% reflective and be deposited over the elevated sections of p-type contact layer and over the ohmic contact.

Figure 6:
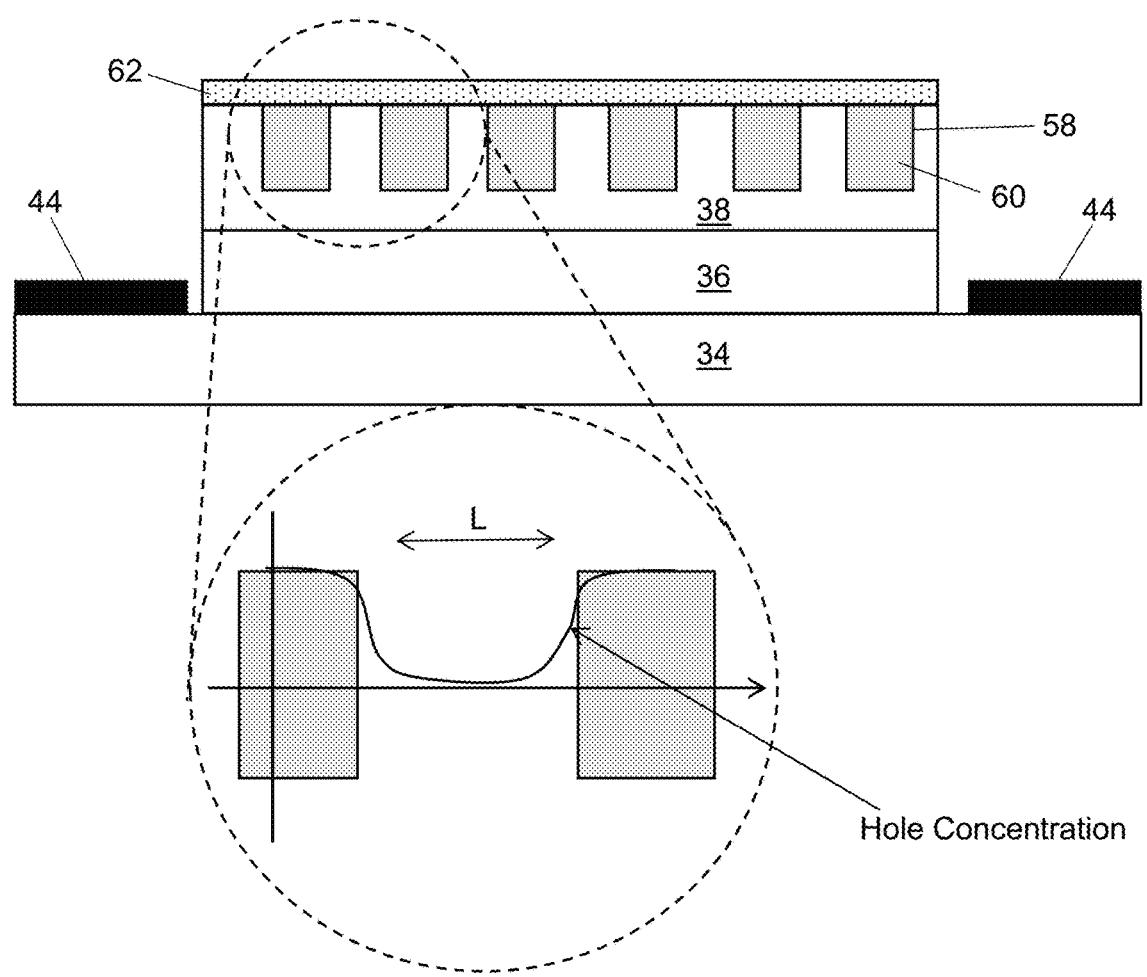
FIG. 6 illustrates a distance of separation between columnar structures of a p-type contact layer according to an embodiment of the present invention.

FIG. 6 illustrates a distance of separation between columnar structures 60 of the p-type contact layer 58 according to an embodiment of the present invention. In one embodiment, each columnar structure 60 can be separated from an adjacent columnar structure by a distance L that is comparable to a current spreading length of the ultraviolet transparent semiconductor layer that can form the transparent electron blocking layer 38, provided that the transparent electron blocking layer has p-type doping. As used herein, comparable means within +/−50%. In another embodiment, each columnar structure 60 can be separated from an adjacent columnar structure by a distance L that is comparable to a hole diffusion distance of the ultraviolet transparent semiconductor layer that can form the transparent electron blocking layer 38, provided that the transparent electron blocking layer is undoped. In one embodiment, the p-type contact layer can be at least 30% transparent to the emitted radiation, and the transparent electron blocking layer can have a p-type doping that results in at least $10^{18}$ holes per cubic centimeter.

Figure 7:
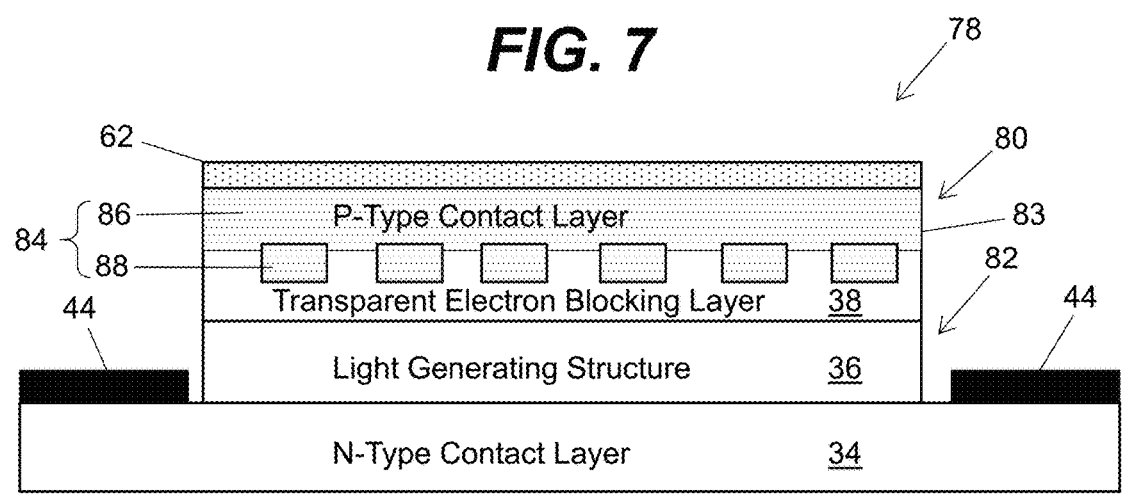
FIG. 7 shows a schematic of an optoelectronic device having a p-type contact to a semiconductor heterostructure according to an embodiment of the present invention, wherein a p-type contact layer includes a superlattice structure.

FIG. 7 shows a schematic of an optoelectronic device 78 having a p-type contact 80 to a semiconductor heterostructure 82 according to an embodiment of the present invention. In this embodiment, the p-type contact 80 includes a p-type contact layer 83 that can include a superlattice structure 84. The superlattice structure 84 can include a continuous superlattice structure layer 86 and a set of columnar superlattice structures 88. As shown in FIG. 7, the continuous superlattice structure layer 86 can be formed between the transparent electron blocking layer 38 and a transparent contact 62, while the set of columnar superlattice structures 88 extend from the continuous superlattice structure layer 86 towards the transparent electron blocking layer 38. This structure results in both the superlattice structure 84 that forms the p-type contact layer 83 and the transparent electron blocking layer 38 having a laterally non-uniform thickness. Like the embodiment described with respect to FIG. 2, the p-type contact layer 83 and the transparent electron blocking layer 38 can each have a pattern characterized by a plurality of elevated sections and a plurality of lower sections, with each elevated section followed by a lower section. In this manner, the elevated sections of the transparent electron blocking layer 38 can adjoin the elevated sections of the p-type contact layer 83, and the lower sections of the transparent electron blocking layer can adjoin the lower sections of the p-type contact layer.

In one embodiment, the superlattice structure 84 can include interlaced sets of barriers and quantum wells. To this extent, each quantum well in the superlattice structure formed from superlattice structures 86 and 88 can have one or more adjacent barriers, while each barrier in the superlattice structure can have one or more adjacent quantum wells. The barriers and quantum wells in the superlattice structure 84 can be formed using different material compositions. In one embodiment, the superlattice structure 84 can have either p-type or n-type barriers and quantum wells, depending on the desired functionality of the superlattice structure in the optoelectronic device 78. In any event, the barriers and quantum wells of the superlattice structure 84 can be formed of any of the aforementioned group III nitride material compositions. In one embodiment, the barriers of the superlattice structure 84 can include an aluminum gallium nitride (AlGaN) composition comprising a molar fraction of aluminum that can be expressed as $Al_xGa_{1-x}N$, while the quantum wells can include an AlGaN composition comprising a molar fraction of aluminum nitride that can be expressed as $A_yGa_{1-y}N$. For example, the molar fraction of aluminum nitride within the quantum wells can range between 0-0.4 and the molar fraction of aluminum nitride within the barriers can range between 0.2-1. In a still more specific illustrative embodiment, the transparent electron blocking layer 38 can include a superlattice structure, while the p-type contact layer 83 can include a large (at least 0.5) molar fraction of gallium nitride. U.S. patent application Ser. No. 13/803,753 provides further details of a superlattice structure which is applicable to the superlattice structure 84 of the p-type contact layer 83 depicted in FIG. 7.

Figure 8A:
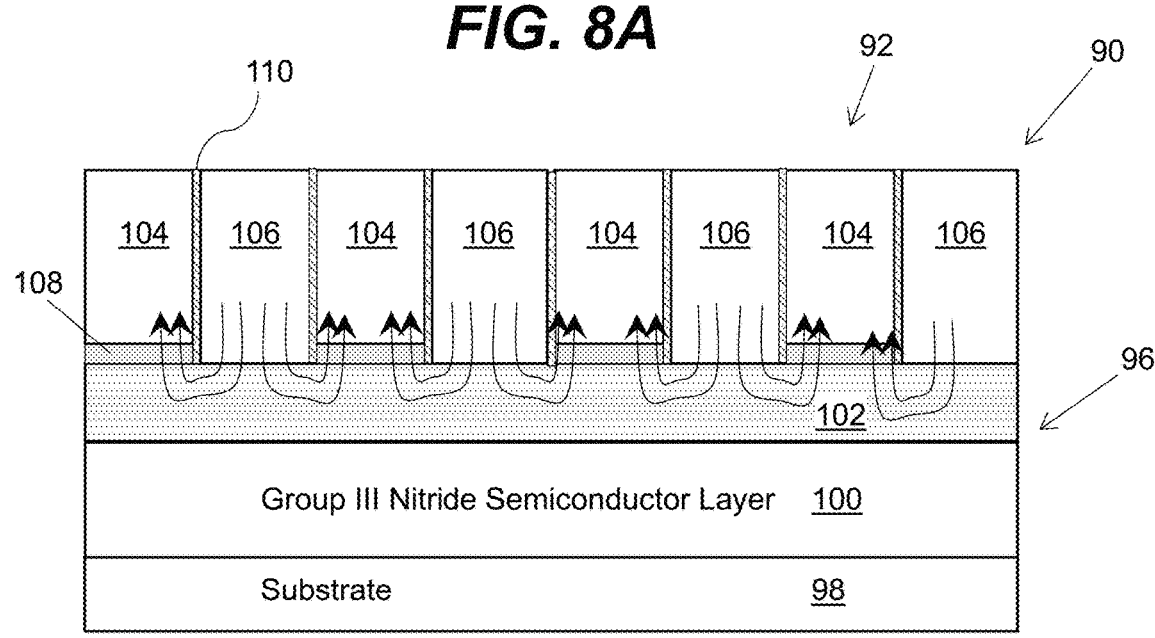
Figure 8B:
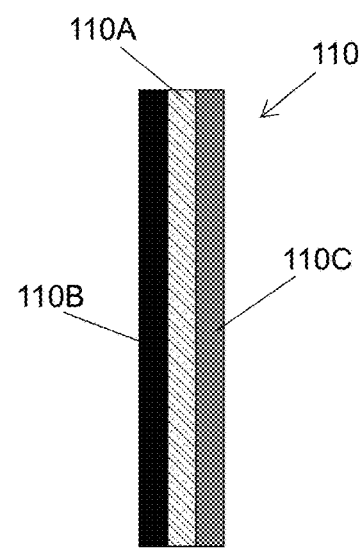
FIG. 8B shows further details of an insulating layer depicted in FIG. 8A that separates each of the columnar structures.

FIGS. 8A-8B show a schematic of an optoelectronic device 90 according to another embodiment of the present invention. The optoelectronic device 90 as shown in FIG. 8A includes a p-type contact 92 to a semiconductor heterostructure 96. FIG. 8A shows that the semiconductor heterostructure 96 can include a substrate 98, a group III nitride semiconductor layer 100, such as an n-type contact layer, formed over the substrate, and a light generating structure 102 having a set of quantum wells and barriers configured to emit or absorb target radiation formed over the group III nitride semiconductor layer. The p-type contact 92 can include a set of columnar structures formed over the light generating structure 102. In particular, the set of columnar structures can include a plurality of p-type columnar structures 104 and a plurality of n-type columnar structures 106 extending laterally over the light generating structure 102. As shown in FIG. 8A, each p-type columnar structure 104 is adjacent an n-type columnar structure 106 to form an alternating pattern of p-type columnar structures and n-type columnar structures. Both of the p-type columnar structures 104 and the plurality of n-type columnar structures 106 can only take a fraction (e.g., approximately twenty percent or less) of the lateral area of the light generating structure 102.

In one embodiment, the set of columnar structures formed of the p-type columnar structures 104 and the n-type columnar structures 106 extend from the light generating structure 102 outward away from the substrate 98. In particular, the set of columnar structures are formed on a first surface of the light generating structure 102 that is opposite another side of the light generating structure that is formed over the group III nitride semiconductor layer 100 and the substrate 98.

In one embodiment, each of the p-type columnar structures 104 can include an electron blocking layer 108 formed between one end of the p-type columnar structures and the light generating structure 102. In this manner, the electron blocking layer 108 physically isolates the p-type columnar structures 104 from the light generating structure 102. In operation, the electron blocking layer 108 can help by improving the overall light transparency of the p-type contact 92. The electron blocking layer 108 can include, but is not limited to, $Al_xGa_{1-x}N$. It is understood that the electron blocking layer 108 is illustrative of one approach that can be used to improve the overall light transparency, and is not meant to limit this embodiment or any others described herein that show the option of using the electron blocking layer. For example, the p-type columnar structures 104 could be implemented with other sublayers that are designed to improve overall light transparency.

Insulating layers 110 can be formed between each p-type columnar structure 104 and n-type columnar structure 106. As shown in FIG. 8B, each insulating layer 110 can include a dielectric material 110A such as $SiO_2$, AAO, Hafnium, $CaF_2$, $MgF_3$, ZnO, AlZnO, and/or the like, formed between a first metallic contact 110B and a second metallic contact 110C. In this manner, each of the first metallic contact 110B and the second metallic contact 110C abuts one of a p-type columnar structure 104 and an n-type columnar structure 106, while the dielectric material 110 can insulate the p-type columnar structures from the n-type columnar structures. In one embodiment, the insulating layers 110 can have a characteristic size (e.g., lateral diameter) of at least a hole diffusion length.

In the operation of the optoelectronic device 90, the p-type columnar structures 104 and the n-type columnar structures 106 can provide a lateral current throughout the light generating structure 102. The flow of the lateral current in the light generating structure 102 can be represented by the arrowed lines flowing from the n-type columnar structures 106 to the light generating structure 102, laterally across a portion of the light generating structure, and up into a p-type columnar structure 104. The columnar structures 104 and 106 can be fabricated by using photolithography or masking and epitaxial overgrowth—both methods well known in art of epitaxial growth. It is understood that the lateral conductivity per unit thickness of the superlattice structure that can form the light generating structure 102 can be significant along the superlattice due to formation of a 2D gas at the quantum well/barrier heterojunctions in the superlattice.

In one embodiment, the p-type columnar structures 104 and the n-type columnar structures 106, like the semiconductor layer 100 and the light generating structure, can include any of the aforementioned group III nitride material compositions. In one embodiment, the p-type columnar structures 104 and the n-type columnar structures 106 can include a GaN p-type contact layer. Alternatively, the p-type contact layer can comprise a group III nitride short period superlattice. The n-type contact layer can comprise an AlGaN n-type layer being transparent to radiation of a target wavelength. The substrate 98 can include sapphire, silicon carbide (SiC), silicon (Si), GaN, AlGaN, AlON, $LiGaO_2$, or any another suitable material.

The optoelectronic device 90 of FIG. 8A can be formed by an overgrowth method. An overgrowth method can be utilized over a method of etching for the purposes of yielding well preserved pseudomorphic layers. In one embodiment, the optoelectronic device 90 can be formed by first growing the n-type group III nitride semiconductor layer 100 epitaxially over the substrate 98. This can be followed by growing the quantum wells and barriers of the light generating structure 102. Next, a domain of the light generating structure 102 can be masked, while unmasked domains can be used to grow an n-type layer. The masking used in the masked domains can then be removed, and then using subsequent masking, more of the n-type layer can be grown. The unmasked regions can then be used for epitaxial growth of the layer. In this manner, the p-type columnar structures 104 can be obtained by a first epitaxial growth over the light generating structure 102 having a first patterning of a masking layer, while the n-type columnar structures 106 can be obtained by a second epitaxial growth over the light generating structure 102 having a second patterning of the masking layer. In one embodiment, the masking layer can include an electrically insulating and ultraviolet transparent material, such as, for example, $SiO_2$, AAO, and/or the like. In one embodiment, the masking can be removed after epitaxial growth on the n-type columnar structures 106. In one embodiment, the light generating structure 102 can be patterned prior to the deposition of the p-type columnar structures 104 and the n-type columnar structures 106. The patterning of the light generating structure can have elevated sections followed by lower sections. In this manner, the p-type columnar structures 104 and the n-type columnar structures 106 can be grown in the lower sections of the light generating structure 102.

Figure 9:
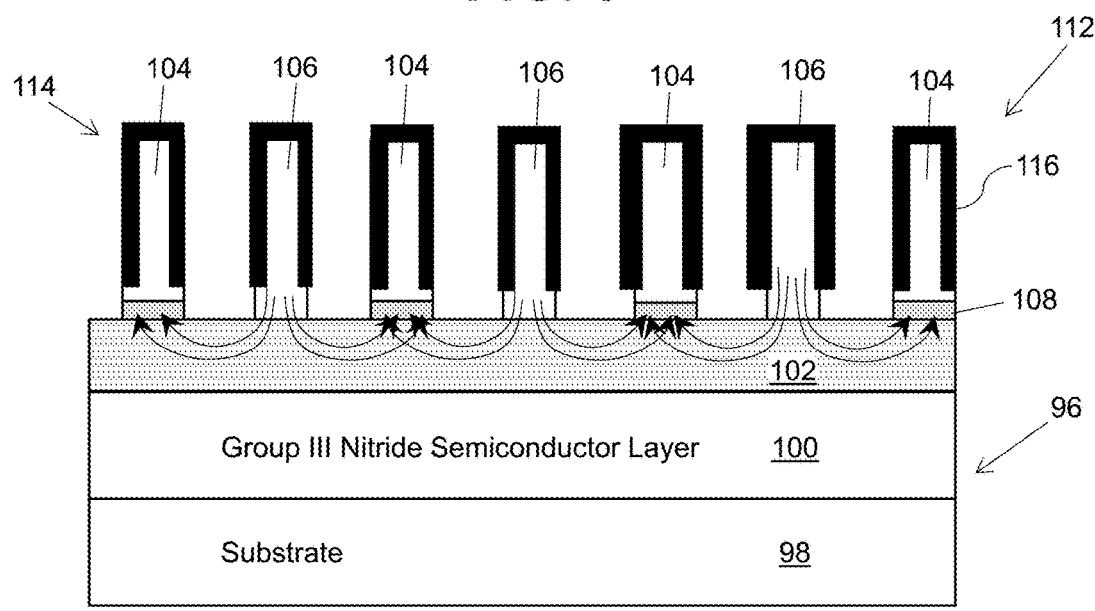
FIG. 9 shows a schematic of an optoelectronic device having a p-type contact to a semiconductor heterostructure according to an embodiment of the present invention, wherein p-type columnar structures are separated from adjacent n-type columnar structures by a predetermined spacing.

FIG. 9 shows a schematic of an optoelectronic device 112 having a p-type contact 114 to the semiconductor heterostructure 96 according to an embodiment of the present invention. In this embodiment, the p-type columnar structures 104 can be separated from adjacent n-type columnar structures 106 by a predetermined spacing or opening. The distance of the spacing between the p-type columnar structures 104 and the n-type columnar structures 106 can be comparable to the hole diffusion length which is given by $\sqrt{D\tau_p}=\sqrt{kT\mu_p\tau_p/q}$, where D is a diffusion coefficient, $\tau_p$ is a lifetime of holes within the layer before recombination, kT is thermal energy, $\mu_p$ is the hole mobility, and q is an electron charge. Generally, the spacing can be estimated to be on the order of 1 micrometer.

FIG. 9 also shows that each of the p-type columnar structures 104 and the n-type columnar structures 106 can have a metallic contact layer 116 formed there over. In this manner, the metallic contact layer 116 can improve contact to the semiconductor heterostructure 96. In one embodiment, each metallic contact layer 116 can substantially enclose the p-type columnar structures 104 and the n-type columnar structures 106 on three sides.

Figure 10:
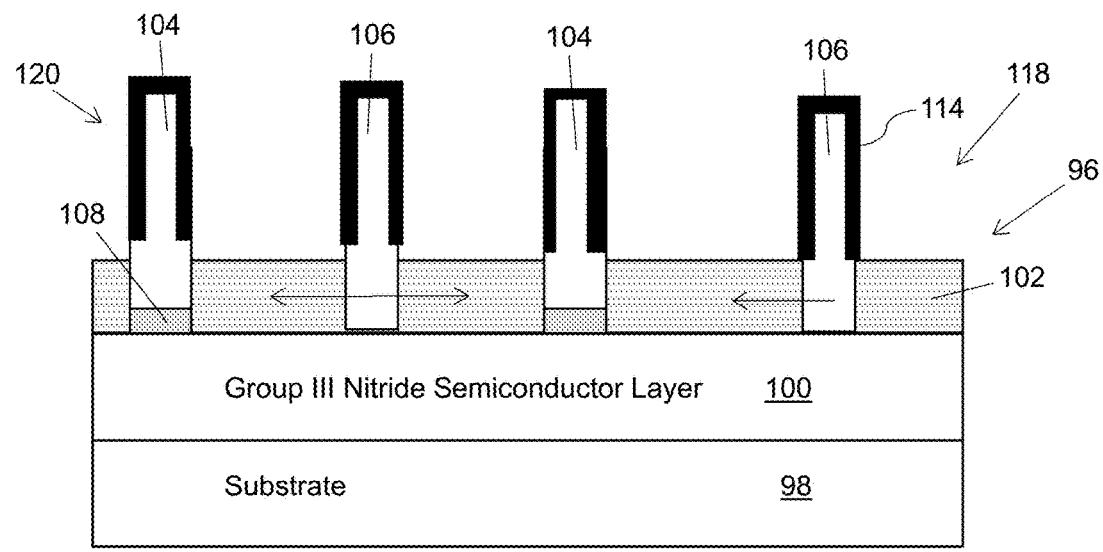
FIG. 10 shows a schematic of an optoelectronic device having a p-type contact to a semiconductor heterostructure according to an embodiment of the present invention, wherein p-type columnar structures and n-type columnar structures penetrate into a light generating structure.

FIG. 10 shows a schematic of an optoelectronic device 118 having a p-type contact 120 to the semiconductor heterostructure 96 according to an embodiment of the present invention. In this embodiment, the p-type columnar structures 104 and the n-type columnar structures 106 of the p-type contact 120 can penetrate into the light generating structure 102. Having the p-type columnar structures 104 and the n-type columnar structures 106 of the p-type contact 120 penetrate into the light generating structure 102 can serve to decrease current crowding associated with current having a more complex path (as shown for example in FIG. 9 by curved arrows within the layer 102) as opposed to a direct path as shown by straight arrows within the layer 102.

Figure 11:
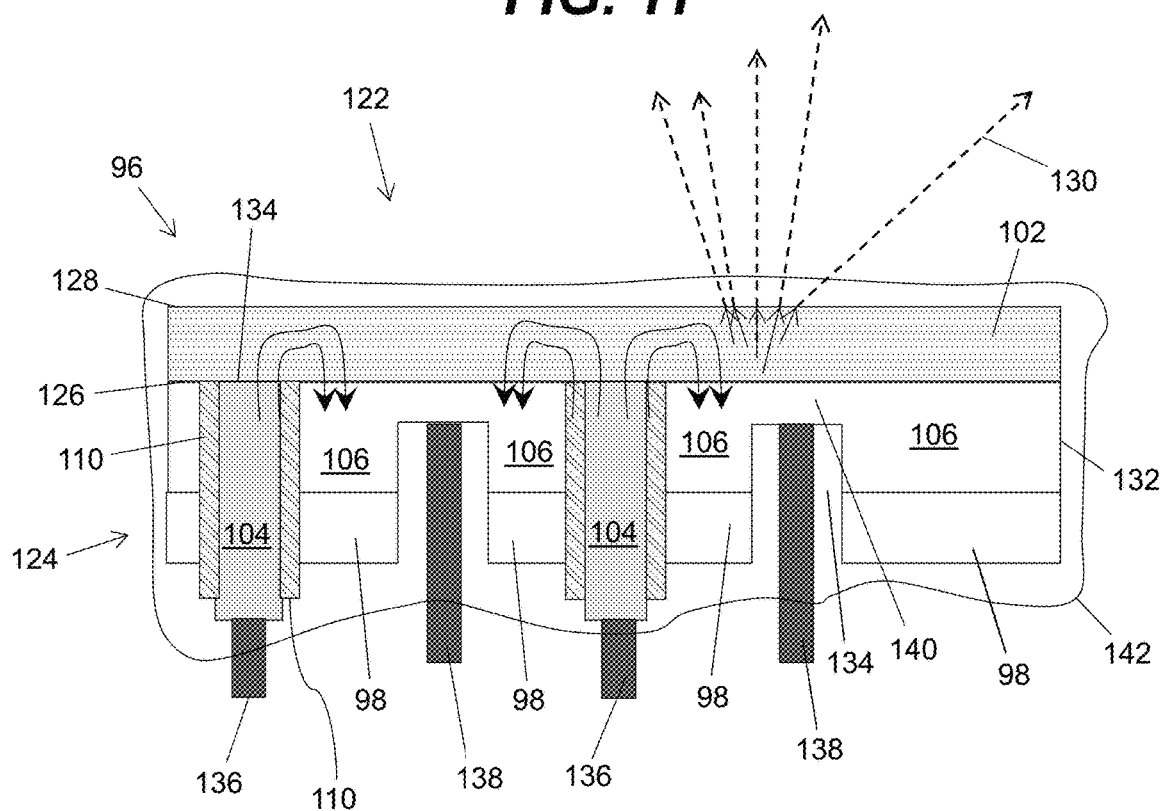
FIG. 11 shows a schematic of an optoelectronic device having a p-type contact to a semiconductor heterostructure according to an embodiment of the present invention, wherein p-type columnar structures and n-type columnar structures extend from a light generating structure towards a substrate.

FIG. 11 shows a schematic of an optoelectronic device 122 having a p-type contact 124 to a semiconductor heterostructure 96 according to an embodiment of the present invention. In this embodiment, the p-type columnar structures 104 and the n-type columnar structures 106 extend from the light generating structure 102 towards the substrate 98. In particular, both the p-type columnar structures 104 and the n-type columnar structures 106 are formed on a first side 126 of the light generating structure 102 facing the substrate. In this manner, a second side 128 of the light generating structure, opposing the p-type columnar structures 104, the n-type columnar structures 106 and the substrate 98 can be configured to emit light into the ambient as evidenced by the rays 130.

As shown in FIG. 11, the p-type columnar structures 104 can be formed between the n-type columnar structures 106 with the insulating layers 110 separating the p-type columnar structures from portions of both the n-type columnar structures 106 and the substrate 98. In one embodiment, the n-type columnar structures 106 are formed from an n-type contact layer 132 formed on the first side 126 of the light generating structure 102. Depressions or voids 134 can be formed in the n-type contact layer 132 and the substrate 98. A first set of the depressions 134 can extend through all of the n-type contact layer 132 and the substrate 98, while a second set of the depressions can extend through all of the substrate and only a portion of the n-type contact layer.

Both the first set and the second set of the depressions 134 have a role in shaping the n-type columnar structures 106. In one embodiment, some n-type columnar structures 106 are bridged together because the second set of depressions 134 only extends through a portion of the n-type contact layer 132, while the first set of depressions 134 that extend through both the substrate 98 and the n-type contact layer to the first side 126 of the light generating structure 102, completely separate some of the n-type columnar structures 106 from another n-type columnar structure. The p-type columnar structures 106 and the insulating layer 110 can be formed in this first set of the depressions 134. In this manner, the p-type columnar structures 106 and the insulating layer 110, which can extend through both the n-type contact layer 132 and the substrate 98, can separate adjacent pairs of bridged n-type columnar structures. As shown in FIG. 11, a p-type electrode 136 can be formed on the p-type columnar structure 104, while an n-type electrode 138 can be formed on the n-type columnar structures 106. In one embodiment, the n-type electrode 138 can be applied to the bridging portion 140 of adjacent pairs of bridged n-type columnar structures 106.

In the operation of the optoelectronic device 122, the p-type columnar structures 104 and the n-type columnar structures 106 can provide a lateral current throughout the light generating structure 102 as shown by the arrowed lines flowing from the p-type columnar structures 104 to the light generating structure 102, laterally across a portion of the light generating structure, and down into an n-type columnar structure 104. In particular, the columnar structures can be fabricated to provide the current through the active structure 102, wherein fabrication of columnar structure can be achieved through photolithography or masking and epitaxial overgrowth technique as known in art.

The p-type columnar structures 106 and the insulating layer 110 can be formed in this first set of the depressions 134. In this manner, the p-type columnar structures 106 can extend through both the n-type contact layer 132 and the substrate 98. As shown in FIG. 11, a portion of the insulating layers on both sides of the p-type columnar structures 104 can extend beyond both the n-type contact layer 132 and the substrate 98.

In one embodiment, the optoelectronic device 122 can include an encapsulant 142 to encapsulate the substrate 98, the n-type contact layer 132 including the n-type columnar structures 106, the p-type contact 124 including the p-type columnar structures 104 and the light generating structure 102. The encapsulant 142, which can improve the contact's adhesion and light extraction, can include a transparent ultraviolet material such as a fluoropolymer. Examples of fluoropolymers that are suitable for use as the encapsulant 142 include, but are not limited to, ethylene tetrafluoroethylene (ETFE), tetrafluoroethylene hexafluoropropylene fluoroterpolymer (EFEP), an amorphous fluoroplastic (e.g., Teflon AF), and/or the like. In one embodiment, the entire optoelectronic device is preferably encapsulated by the encapsulant 142 in order to protect the device from damage. U.S. patent application Ser. No. 14/708,478, which is hereby incorporated by reference, provides more details on using a fluoropolymer for encapsulation purposes. While the encapsulant 142 is only depicted in FIG. 11, it is understood that the other embodiments described herein can utilize such an encapsulant.

The optoelectronic device 122 of FIG. 11 can be formed using an overgrowth process of the p-type contact 124, etching a part of the n-type contact layer 132, and inverting the device for p-type epitaxial growth. In particular, the optoelectronic device can be formed by a growth process that includes: epitaxially growing the first set of semiconductor layers forming the buffer layer and transparent semiconductor layer to target radiation over a suitable substrate; epitaxially growing the active layer comprising a set of quantum wells and barriers; masking domains of the semiconductor layer that will be used for n-type contact connection; epitaxially growing an electron blocking layer and a p-type contact layer having p-type doping in the unmasked portion over a semiconductor structure; un-masking the previously masked domains for n-type contact connection with un-masking done such that there is some masking left to separate p-type and n-type contact regions; masking the p-type contact layer; epitaxially growing an n-type contact layer having n-type doping; and attaching electrodes to the n-type and p-type contact regions.

Figure 12:
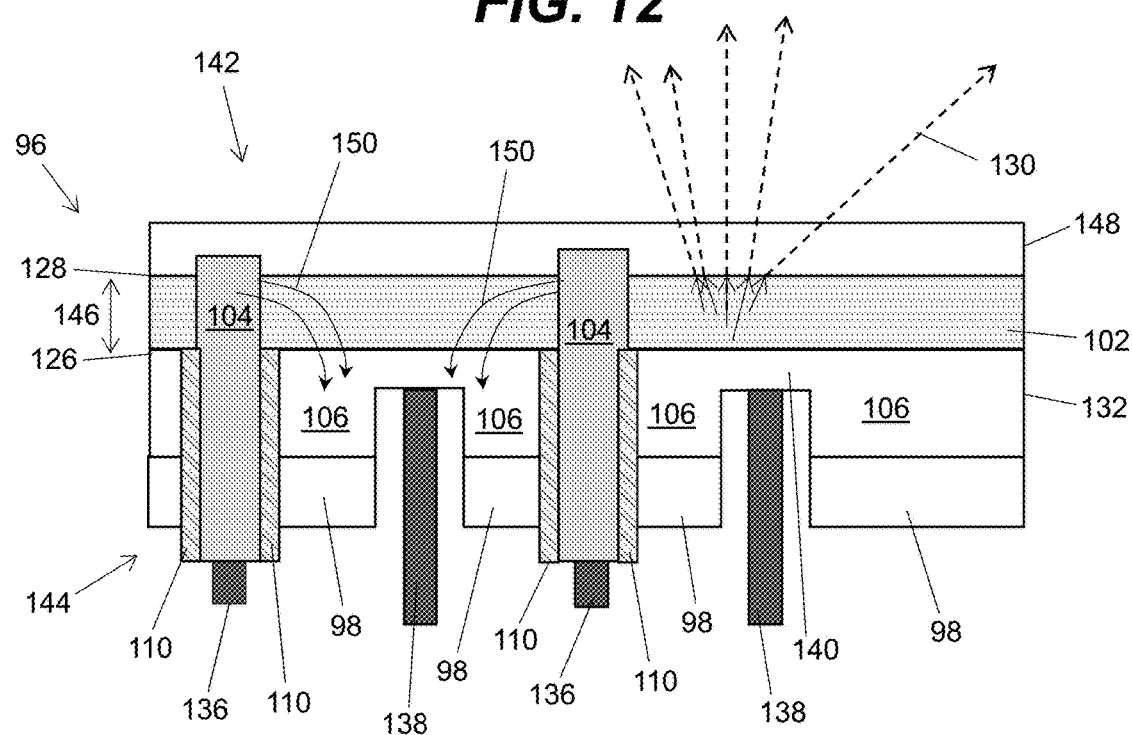
FIG. 12 shows a schematic of an optoelectronic device having a p-type contact to a semiconductor heterostructure according to an embodiment of the present invention, wherein p-type columnar structures and n-type columnar structures extend from a light generating structure towards a substrate, with the p-type columnar structures penetrating into the light generating structure and the n-type columnar structures formed in an interior portion of a group III nitride semiconductor layer.

FIG. 12 shows a schematic of an optoelectronic device 142 having a p-type contact 144 to a semiconductor heterostructure 96 according to an embodiment of the present invention. In this embodiment, the p-type columnar structures 104 extend into the light generating structure 102 and penetrate through its thickness 146 into a UV transparent semiconductor layer 148. The UV transparent semiconductor layer 148 can include, but is not limited to, a group III nitride semiconductor layer, such as AlGaN, AlN, AlGaInN, and/or the like, with a molar fraction of aluminum nitride selected to result in transparency to target radiation. Having the p-type columnar structures 104 penetrate through the light generating structure 102 into the UV transparent semiconductor layer 148 allows for changes in the current pattern as shown by arrows 150, which can improve spreading of the current throughout the light generating structure 102.

Figure 13:
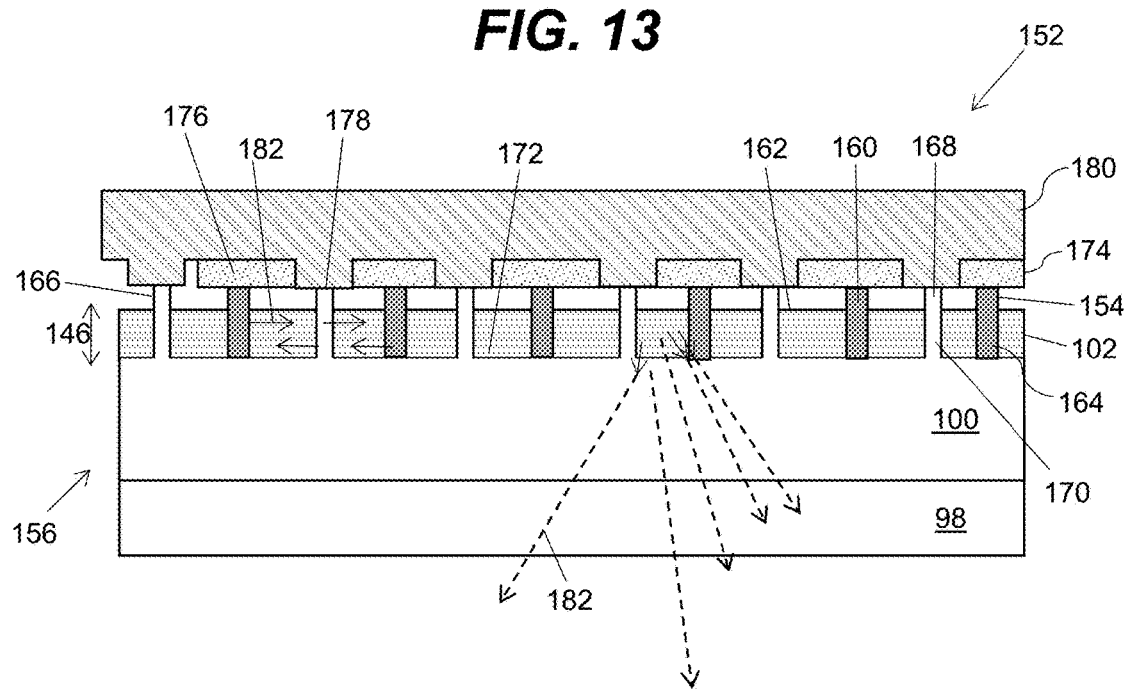
FIG. 13 shows a schematic of an optoelectronic device having a p-type contact to a semiconductor heterostructure according to an embodiment of the present invention, wherein a discontinuous p-type contact layer is formed over a light generating structure and a discontinuous n-type contact layer is formed between discontinuous sections of the discontinuous p-type contact layer, with p-type protrusions extending from the discontinuous sections of the p-type contact layer into the light generating structure and n-type protrusions extending from the discontinuous n-type contact layer into the light generating structure.

FIG. 13 shows a schematic of an optoelectronic device 152 having a p-type contact layer 154 to a semiconductor heterostructure 156 according to an embodiment of the present invention. As shown in FIG. 13, the semiconductor heterostructure 156 can include the substrate 98, the group III nitride semiconductor layer 100 formed over the substrate and the light generating structure 102 having a set of quantum wells and barriers configured to emit or absorb target radiation, and which is formed over the group III nitride semiconductor layer. The p-type contact layer 154 can include a discontinuous p-type contact layer formed over the light generating structure 102. In one embodiment, the discontinuous p-type contact layer 154 can include sections 160 of the p-type contact layer. Each section 160 of the p-type contact layer 154 can be separated from an immediately adjacent section 160 by a predetermined spacing 162. A plurality of p-type protrusions 164 can extend from the discontinuous sections 160 of the p-type contact layer 154 into the light generating structure 102. Both the p-type contact layer 154 and the p-type protrusions 164 can be made from any of the aforementioned group III nitride semiconductor materials.

An n-type contact layer 166 can be formed over the light generating structure 102. The n-type contact layer 166 can include a discontinuous n-type contact layer formed over the light generating structure 102. In one embodiment, the discontinuous n-type contact layer 166 can include sections 168 of the n-type contact layer. In one embodiment, each section 168 of the n-type contact layer 166 can be formed in the spacing 162 between each of the discontinuous sections 160 of the p-type contact layer 154. A plurality of n-type protrusions 170 can extend from the n-type contact layer 166 into the light generating structure 102. In particular, each section 168 of the n-type contact layer 166 can have an n-type protrusion 170 that penetrates into the light generating structure 102. As shown in FIG. 13, the plurality of n-type protrusions 170 and the plurality of p-type protrusions 164 can be in parallel. Furthermore, FIG. 13 shows that the n-type protrusions 170 can be alternate with the p-type protrusions 164. Both the n-type contact layer 166 and the n-type protrusions 168 can be made from any of the aforementioned group III nitride semiconductor materials.

In one embodiment, light generating structure 102 can include a discontinuous light generating structure including sections 172 of the light generating structure. In one embodiment, each of the sections 172 of the light generating structure 102 can be separated from an adjacent section of the light generating structure by either a p-type protrusion 164 or an n-type protrusion 170.

The optoelectronic device 152 can further include a discontinuous p-type metallic contact layer 174 formed over the discontinuous p-type contact layer 154. In one embodiment, the discontinuous p-type metallic contact layer 174 can include sections 176 of the p-type metallic contact layer. In one embodiment, each section 176 of the p-type metallic contact layer 174 can contact one of the plurality of p-type protrusions 164. As shown in FIG. 13, each section 176 of the p-type metallic contact layer 174 can be separated from an immediately adjacent section by a predetermined spacing 178.

The optoelectronic device 152 can further include an n-type metallic contact layer 180 formed over the p-type metallic contact layer 174. In one embodiment, the n-type metallic contact layer 180 can be formed in the spacing 178 between each of the discontinuous sections 176 of the p-type metallic contact layer 174. In one embodiment, the n-type metallic contact layer 180 can contact one of the plurality of n-type protrusions 170 in the spacing 178 formed between each of the discontinuous sections 176 of the p-type metallic contact layer 174. It is understood that the p-type metallic contact layer 174 and the n-type metallic contact layer 180 can have an insulator at their interface to prevent the current from traveling from the p-type contact layer 154 into the n-type contact layer 166 directly.

The optoelectronic device 152, like other devices described herein, can result in a formation of a lateral current throughout the quantum wells and barriers of the light generating structure 102. As shown in FIG. 13, the current travels laterally along the light generating structure 102 as shown by arrows 182, resulting in a reduction of resistance due to, for example, reduced barriers across the quantum well structure of the light generating structure 102. It is understood that the thickness 146 of the light generating structure 102 can be substantial enough to result in large emission and reduced resistivity of the light generating structure. Furthermore, it is understood that the thickness of the p-type protrusions 164 and the n-type protrusions 170 can be selected to match the resistivity in the lateral direction along the light generating structure 102.

Figure 14A:
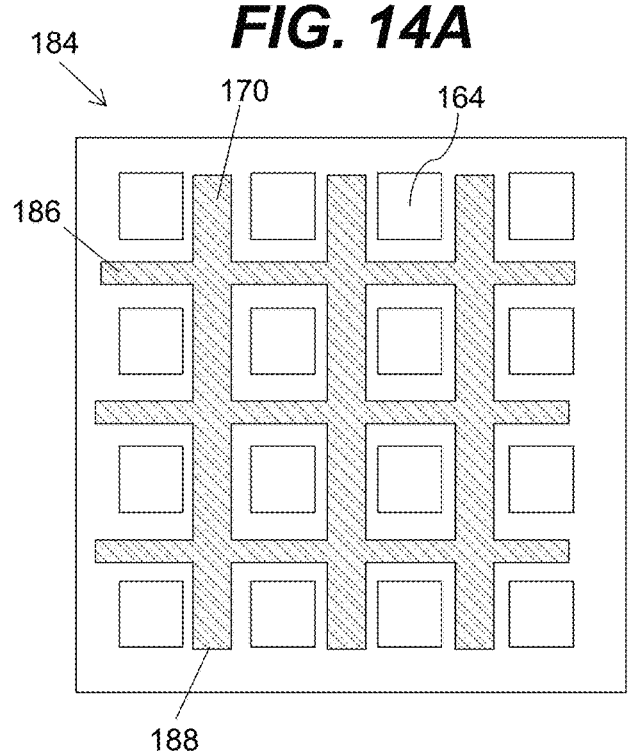
FIGS. 14A-14B show a top view of the p-type protrusions and the n-type protrusions depicted in the p-type contact to the semiconductor heterostructure of FIG. 13 according to an embodiment of the present invention.
Figure 14B:
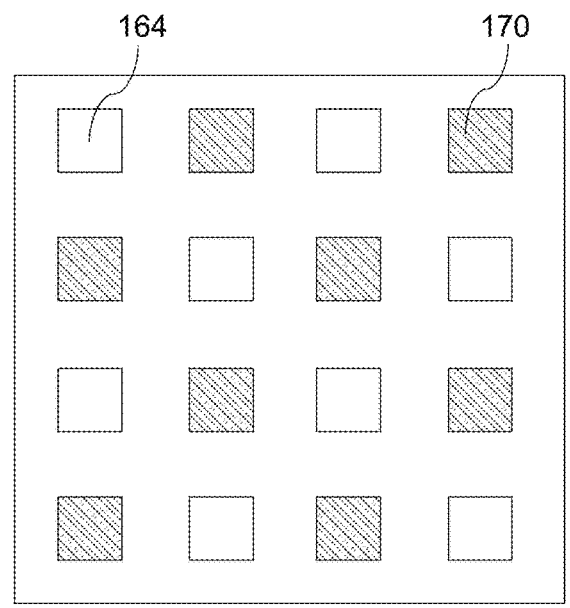

As shown in FIG. 13, each p-type protrusion 164 extending into the light generating structure 102 can alternate with one n-type protrusion 170 extending into the light generating structure. In this manner, as shown in the top view of FIGS. 14A-14B, the p-type protrusions 164 can form an array of rectangular regions connected by the p-type contact layer (not shown in these figures), while the n-type protrusions 170 can be located between the p-type protrusions. From the view point depicted in FIG. 14A, the n-type protrusion can form a grid 184 of parallel horizontal protrusions 186 and vertical protrusions 188, with each p-type protrusion 164 located in a spacing separating one of the parallel horizontal protrusions 186 and the vertical protrusions 188. In one embodiment, the p-type protrusions 164 can form stripes and/or columns of various shapes other than rectangular regions. In one embodiment, these metal stripes and/or columns can form a photonic crystal for coupling to electromagnetic radiation.

The optoelectronic device 152 of FIG. 13 can be formed by growing the n-type layer 166 using masking to obtain the n-type protrusions 170, which are overgrown (with corresponding masking) by the light generating structure 102 to form the sections 172. The subsequent growth of the layer 154 can be performed after removing the mask, resulting in the p-type protrusions 164. An example of a masking sequence and epitaxial growth sequence with trivial changes is similar to the set of fabrication steps outlined herein with reference to the optoelectronic device 122 of FIG. 11.

The optoelectronic devices of the various embodiments described herein can have their p-type contact layers roughened to improve electromagnetic radiation extraction. In one embodiment, the top surface of the exposed p-type semiconductor regions of the p-type contact layer can be roughened for improved electromagnetic radiation extraction. In another embodiment, the surface of the regions between the p-type semiconductor regions of the p-type contact layer can be roughened for improved electromagnetic radiation extraction. Roughening a surface of the p-type semiconductor regions can include forming roughness elements on an exterior side surface, an interior portion, or an edge portion. The size and shape of the roughness elements can be optimized to improve light extraction from the p-type semiconductor regions. Those skilled in the art will appreciate that the roughness elements can include a variety of etched domains with sizes and shapes that are at least a wavelength of a target radiation. For example, the roughness elements can include truncated pyramids, inverted truncated pyramids, conical elements, protrusions, externally deposited shapes, and/or the like. In another embodiment, the roughness elements can be patterned to have a periodic structure or an aperiodic structure.

Figure 15:
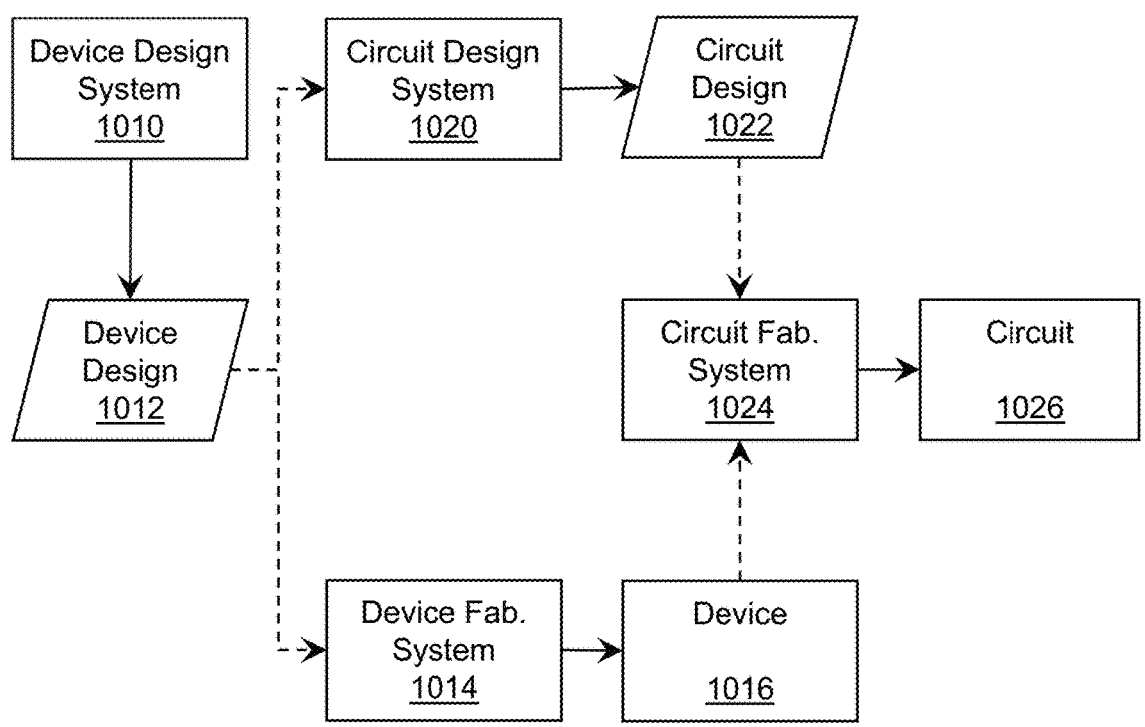
FIG. 15 shows an illustrative flow diagram for fabricating a circuit that includes an optoelectronic device having one or more of the p-type contacts to a semiconductor structure described according to the various embodiments of the present invention.

In one embodiment, the invention provides a method of designing and/or fabricating a circuit that includes one or more of the devices designed and fabricated as described herein (e.g., including one or more devices having a p-type contact described herein). To this extent, FIG. 15 shows an illustrative flow diagram for fabricating a circuit 1026 according to an embodiment. Initially, a user can utilize a device design system 1010 to generate a device design 1012 for a semiconductor device as described herein. The device design 1012 can comprise program code, which can be used by a device fabrication system 1014 to generate a set of physical devices 1016 according to the features defined by the device design 1012. Similarly, the device design 1012 can be provided to a circuit design system 1020 (e.g., as an available component for use in circuits), which a user can utilize to generate a circuit design 1022 (e.g., by connecting one or more inputs and outputs to various devices included in a circuit). The circuit design 1022 can comprise program code that includes a device designed as described herein. In any event, the circuit design 1022 and/or one or more physical devices 1016 can be provided to a circuit fabrication system 1024, which can generate a physical circuit 1026 according to the circuit design 1022. The physical circuit 1026 can include one or more devices 1016 designed as described herein.

In another embodiment, the invention provides a device design system 1010 for designing and/or a device fabrication system 1014 for fabricating a semiconductor device 1016 as described herein. In this case, the system 1010, 1014 can comprise a general purpose computing device, which is programmed to implement a method of designing and/or fabricating the semiconductor device 1016 as described herein. Similarly, an embodiment of the invention provides a circuit design system 1020 for designing and/or a circuit fabrication system 1024 for fabricating a circuit 1026 that includes at least one device 1016 designed and/or fabricated as described herein. In this case, the system 1020, 1024 can comprise a general purpose computing device, which is programmed to implement a method of designing and/or fabricating the circuit 1026 including at least one semiconductor device 1016 as described herein.

In still another embodiment, the invention provides a computer program fixed in at least one computer-readable medium, which when executed, enables a computer system to implement a method of designing and/or fabricating a semiconductor device as described herein. For example, the computer program can enable the device design system 1010 to generate the device design 1012 as described herein. To this extent, the computer-readable medium includes program code, which implements some or all of a process described herein when executed by the computer system. It is understood that the term "computer-readable medium" comprises one or more of any type of tangible medium of expression, now known or later developed, from which a stored copy of the program code can be perceived, reproduced, or otherwise communicated by a computing device.

In another embodiment, the invention provides a method of providing a copy of program code, which implements some or all of a process described herein when executed by a computer system. In this case, a computer system can process a copy of the program code to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method of generating a device design system 1010 for designing and/or a device fabrication system 1014 for fabricating a semiconductor device as described herein. In this case, a computer system can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; and/or the like.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. A heterostructure, comprising:
an n-type semiconductor contact layer;
a light generating structure formed over the n-type semiconductor contact layer and having a set of quantum wells and barriers configured to emit or absorb target radiation;
an ultraviolet transparent semiconductor layer having a non-uniform thickness and formed over the light generating structure;
a p-type contact semiconductor layer having a non-uniform thickness and formed over the ultraviolet transparent semiconductor layer, wherein the p-type contact semiconductor layer comprises a set of columnar structures; and
a partially reflective metallic contact formed over the p-type contact semiconductor layer, wherein the partially reflective metallic contact is formed directly on the set of columnar structures.

2. The heterostructure of claim 1, wherein the ultraviolet transparent semiconductor layer and the p-type contact semiconductor layer each has a shape corresponding to the non-uniform thickness thereof, wherein the shape of the ultraviolet transparent semiconductor layer is complementary to receive the shape of the p-type contact semiconductor layer.

3. The heterostructure of claim 1, wherein the partially reflective metallic contact comprises a continuous partially reflective metallic contact formed over the p-type contact semiconductor layer, wherein each of the columnar structures is connected by the continuous partially reflective metallic contact.

4. The heterostructure of claim 1, wherein the partially reflective metallic contact comprises a discontinuous partially reflective metallic contact formed over the p-type contact semiconductor layer, wherein the discontinuous partially reflective metallic contact includes a plurality of discontinuous sections of the discontinuous partially reflective metallic contact, each discontinuous section formed directly over one of the columnar structures.

5. The heterostructure of claim 1, wherein the ultraviolet transparent semiconductor layer comprises a superlattice structure and the p-type contact semiconductor layer comprises a composition including gallium.

6. The heterostructure of claim 1, wherein each columnar structure is separated from an adjacent columnar structure by a distance L that is comparable to a current spreading length of the ultraviolet transparent semiconductor p-type layer.

7. The heterostructure of claim 1, wherein each columnar structure is separated from an adjacent columnar structure by a distance L that is comparable to a hole diffusion distance of the ultraviolet transparent semiconductor p-type layer.

8. The heterostructure of claim 2, wherein the shape of the ultraviolet transparent semiconductor layer and the p-type contact semiconductor layer each includes a pattern that reduces a lateral area thereof, the pattern including a plurality of elevated sections and a plurality of lower sections, with each elevated section followed by a lower section, wherein the elevated sections of the ultraviolet transparent semiconductor layer adjoin the elevated sections of the p-type contact semiconductor layer, and the lower sections of the ultraviolet transparent semiconductor layer adjoin the lower sections of the p-type contact semiconductor layer.

9. The heterostructure of claim 4, further comprising a discontinuous partially transmitting passivation layer formed over the p-type contact semiconductor layer, wherein the discontinuous partially transmitting passivation layer contact includes a plurality of discontinuous sections of the partially transmitting passivation layer, each discontinuous section of the partially transmitting passivation layer formed directly over a portion of the ultraviolet transparent semiconductor layer, wherein each discontinuous section of the partially transmitting passivation layer contacts a side surface of one of the discontinuous sections of the discontinuous partially reflective metallic contact.

10. A heterostructure, comprising:
a substrate;
a group III nitride semiconductor layer epitaxially grown over the substrate;
a light generating structure formed over the group III nitride semiconductor layer and having a set of quantum wells and barriers configured to emit or absorb target radiation; and
a set of columnar structures formed over the light generating structure, the set of columnar structures including a plurality of p-type columnar structures and a plurality of n-type columnar structures extending laterally over the light generating structure, with each p-type columnar structure adjacent to an n-type columnar structure, forming an alternating pattern of p-type columnar structures and n-type columnar structures that provides a lateral current throughout the light generating structure.

11. The heterostructure of claim 10, further comprising a plurality of insulating layers, with each insulating layer formed between a p-type columnar structure and an n-type columnar structure.

12. The heterostructure of claim 10, further comprising a plurality of metallic contact layers formed over each of the columnar structures, wherein each metallic contact layer substantially encloses one of a p-type columnar structure and an n-type columnar structure on three sides.

13. The heterostructure of claim 10, wherein each p-type columnar structure is separated from an immediately adjacent n-type columnar structure by a predetermined spacing comparable to a hole diffusion length.

14. The heterostructure of claim 10, wherein each of the p-type columnar structures and the n-type columnar structures penetrates into the light generating structure.

15. The heterostructure of claim 10, wherein each of the p-type columnar structures comprises an electron blocking layer formed between one end of the p-type columnar structures and the light generating structure, wherein the electron blocking layer physically isolates the p-type columnar structures from the n-type columnar structures.

16. The heterostructure of claim 10, wherein the set of columnar structures extend from the light generating structure outward from the substrate.

17. The heterostructure of claim 10, wherein the set of columnar structures extend from the light generating structure towards the substrate.

18. The heterostructure of claim 10, further comprising an encapsulant that encapsulates the substrate, the group III nitride semiconductor layer, the light generating structure, and the set of columnar structures.

19. The heterostructure of claim 17, wherein an end of each of the p-type columnar structures is formed on a surface of the light generating structure and an end of each of the n-type columnar structures is formed in an interior portion of the group III nitride semiconductor layer.

20. A method, comprising:
forming a heterostructure, comprising:
a substrate;
a group III nitride semiconductor layer formed over the substrate;
a light generating structure formed over the group III nitride semiconductor layer and having a set of quantum wells and barriers configured to emit or absorb target radiation;
a set of columnar structures formed over the light generating structure, the set of columnar structures including a plurality of p-type columnar structures and a plurality of n-type columnar structures extending laterally over the light generating structure, with each p-type columnar structure adjacent to an n-type columnar structure, forming an alternating pattern of p-type columnar structures and n-type columnar structures that provides a lateral current throughout the light generating structure.

* * * * *